(12) United States Patent
Bao et al.

(10) Patent No.: US 10,741,663 B1
(45) Date of Patent: Aug. 11, 2020

(54) ENCAPSULATION LAYER FOR VERTICAL TRANSPORT FIELD-EFFECT TRANSISTOR GATE STACK

(71) Applicant: International Business Machines Corporation, Armonk, NY (US)

(72) Inventors: Ruqiang Bao, Niskayuna, NY (US); Hemanth Jagannathan, Niskayuna, NY (US); Michael P. Belyansky, Halfmoon, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/374,732

(22) Filed: Apr. 3, 2019

(51) Int. Cl.
| | |
|---|---|
| *H01L 29/51* | (2006.01) |
| *H01L 29/66* | (2006.01) |
| *H01L 29/78* | (2006.01) |
| *H01L 29/16* | (2006.01) |
| *H01L 27/092* | (2006.01) |
| *H01L 21/28* | (2006.01) |
| *H01L 21/8238* | (2006.01) |

(52) U.S. Cl.
CPC ...... *H01L 29/517* (2013.01); *H01L 21/28194* (2013.01); *H01L 21/823828* (2013.01); *H01L 21/823857* (2013.01); *H01L 21/823864* (2013.01); *H01L 21/823885* (2013.01); *H01L 27/092* (2013.01); *H01L 29/16* (2013.01); *H01L 29/66666* (2013.01); *H01L 29/7827* (2013.01)

(58) Field of Classification Search
CPC . H01L 29/517; H01L 29/16; H01L 29/66666; H01L 29/7827; H01L 21/28194; H01L 21/823828; H01L 21/823857; H01L 21/823864; H01L 21/823885; H01L 27/092
USPC ........................................................ 257/288
See application file for complete search history.

(56) References Cited

U.S. PATENT DOCUMENTS

| | | | |
|---|---|---|---|
| 9,685,536 B2 | 6/2017 | Ping et al. | |
| 9,824,933 B1 | 11/2017 | Pawlak | |
| 9,887,192 B2 | 2/2018 | Nowak et al. | |
| 10,050,125 B1 | 8/2018 | Qi et al. | |
| 10,103,253 B2 | 10/2018 | Chuang et al. | |
| 2018/0069096 A1 | 3/2018 | Chuang et al. | |
| 2018/0090388 A1* | 3/2018 | Anderson | H01L 27/0924 |
| 2018/0226505 A1 | 8/2018 | Kim et al. | |

* cited by examiner

*Primary Examiner* — Tong-Ho Kim
(74) *Attorney, Agent, or Firm* — Vazken Alexanian; Otterstedt, Wallace & Kammer, LLP

(57) ABSTRACT

A vertical transport field-effect transistor includes gate metal protected by a conformal encapsulation layer. Techniques for fabricating the transistor include depositing the conformal encapsulation layer over the gate metal prior to depositing an additional encapsulation layer such as a nitride layer. The conformal encapsulation layer protects the gate metal during deposition of the additional encapsulation layer, thereby avoiding oxidation or nitridation of the gate metal. The conformal encapsulation layer may be an amorphous silicon layer deposited at relatively low temperature.

20 Claims, 10 Drawing Sheets

US 10,741,663 B1

ENCAPSULATION LAYER FOR VERTICAL TRANSPORT FIELD-EFFECT TRANSISTOR GATE STACK

BACKGROUND

The present invention relates generally to the electrical, electronic and computer arts and, more particularly, to vertical transistor structures.

Metal oxide semiconductor field-effect transistors (MOSFETs) include gate electrodes that are electrically insulated from operatively associated semiconductor channels by thin layers of dielectric material. MOSFETs having n-doped source and drain regions employ electrons as the primary current carriers while those having p-doped source and drain regions use holes as primary current carriers. Vertical transport field-effect transistors (VTFETs) have configurations wherein the current between the drain and source regions is substantially normal to the surface of the die. A vertical transport field-effect transistor may, for example, include a semiconductor pillar or fin having top and bottom regions comprising source/drain regions, the portion of the pillar between the source/drain regions defining a channel region.

Vertical transport FETs (VTFETs) are a promising alternative to standard lateral FET structures due to potential benefits, among others, in terms of reduced circuit footprint. A logic circuit comprising VTFETs can be referred to as a "vertical transport logic gate." VTFETs can potentially provide electronic devices comprising logic circuits with improved circuit density. Such logic circuits can be characterized by a lower-number CPP (cell gate pitch) versus comparable logic circuits comprising lateral FET layouts. Minimum wiring pitch can also be relevant for realizing denser vertical FET layouts. The growth of silicon nitride and other encapsulation layers during the fabrication of vertical transport field-effect transistors (VTFETs) can impair the reliability of such transistors.

BRIEF SUMMARY

Monolithic semiconductor structures including one or more vertical transport FETs and fabrication of such structures are aspects of inventions disclosed herein.

In one aspect, an exemplary method of fabricating a vertical transport field-effect transistor structure includes obtaining a first structure including a semiconductor fin extending vertically from a substrate, the semiconductor fin including a top region, a bottom region, and a channel region between the top region and the bottom region. The first structure further includes a bottom source/drain region adjoining the bottom region of the semiconductor fin, a gate dielectric layer adjoining the channel region of the semiconductor fin, a gate metal layer adjoining the gate dielectric layer, a bottom electrically insulating spacer between the bottom source/drain region and the gate metal layer, and a dielectric cap on a top surface of the semiconductor fin. An amorphous encapsulation layer is conformally deposited at a temperature of about four hundred degrees Centigrade or less on the first structure. The amorphous encapsulation layer comprises amorphous silicon, amorphous silicon carbide, amorphous germanium, or amorphous silicon germanium and forms a continuous film on the gate metal layer. A dielectric encapsulation layer is deposited on the amorphous encapsulation layer. The method further includes exposing a top surface of the semiconductor fin, which includes removing a top portion of the amorphous encapsulation layer and the dielectric cap, and epitaxially growing a top source/drain region on the top region of the semiconductor fin.

A further method of fabricating a vertical transport field-effect transistor structure includes obtaining a first structure including first and second semiconductor fins extending vertically from a substrate, each of the first and second semiconductor fins including a top region, a bottom region, and a channel region between the top region and the bottom region. The first structure further includes a first bottom source/drain region adjoining the bottom region of the first semiconductor fin and a second bottom source/drain region adjoining the bottom region of the second semiconductor fin, a gate dielectric layer having a first portion adjoining the channel region of the first semiconductor fin and a second portion adjoining the channel region of the second semiconductor fin, a first work function metal layer adjoining the first portion of the gate dielectric layer and a second work function metal layer adjoining the second portion of the gate dielectric layer, a common metal layer adjoining and electrically connecting the first and second work function metal layers and a first dielectric cap on a top surface of the first semiconductor fin and a second dielectric cap on a top surface of the second semiconductor fin. An amorphous encapsulation layer is conformally deposited at a temperature of about four hundred degrees Centigrade or less on the common metal layer. The amorphous encapsulation layer comprises amorphous silicon, amorphous silicon carbide, amorphous germanium, or amorphous silicon germanium and forms a continuous film on the common metal layer. The method further includes depositing a dielectric encapsulation layer on the amorphous encapsulation layer and exposing a top surface of the first semiconductor fin, which includes removing a first top portion of the amorphous encapsulation layer and the first dielectric cap. A first top source/drain region having a first conductivity type is epitaxially grown on the top region of the first semiconductor fin. A top surface of the second semiconductor fin is exposed by removing a second top portion of the amorphous encapsulation layer and the second dielectric cap. A second top source/drain region having a second conductivity type opposite to the first conductivity type is epitaxially grown on the top region of the second semiconductor fin.

In a further aspect, a vertical transport field-effect transistor structure includes a substrate and a first vertical transport field-effect device including a first semiconductor fin extending vertically with respect to the substrate. The first semiconductor fin includes a top region, a bottom region, and a channel region between the top region and the bottom region. A first bottom source/drain region adjoins the bottom region of the first semiconductor fin and has a first conductivity type. A first gate dielectric layer adjoins the channel region of the first semiconductor fin and includes top edge portions. A first work function metal layer adjoins the gate dielectric layer and includes top edge portions. A bottom dielectric spacer layer is between the first bottom source/drain region and the first work function metal layer. A first top source/drain region is on the top region of the first semiconductor fin and has the first conductivity type. The VTFET structure further includes a second vertical transport field-effect device including a second semiconductor fin extending vertically with respect to the substrate, a second bottom source/drain region adjoining the bottom region of the second semiconductor fin and having a second conductivity type opposite to the first conductivity type, and a second gate dielectric layer adjoining the channel region of the second semiconductor fin. A second work function metal layer adjoins the second gate dielectric layer. The bottom dielectric spacer further extends between the second bottom source/drain region and the second work function metal layer. A second top source/drain region having the second conductivity type is on the top region of the second semiconductor fin. A common metal layer including vertical segments extends over the first work function layer and the second work function layer, each of the vertical segments including a sidewall and a top edge portion. The common metal layer further includes a horizontal segment extending over the bottom spacer layer and between the first vertical transport field-effect device and the second vertical transport field-effect device. A conformal, amorphous encapsulation layer comprising amorphous silicon, amorphous silicon carbide, amorphous Ge, or amorphous SiGe adjoins each sidewall of the vertical segments of the common metal layer and a dielectric encapsulation layer adjoins the conformal amorphous encapsulation layer.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. Where an actor facilitates an action by other than performing the action, the action is nevertheless performed by some entity or combination of entities.

One or more embodiments or elements thereof can be implemented in the form of a computer program product including a computer readable storage medium with computer usable program code for performing the method steps indicated. Furthermore, one or more embodiments or elements thereof can be implemented in the form of a system (or apparatus) including a memory, and at least one processor that is coupled to the memory and operative to perform exemplary method steps. Yet further, in another aspect, one or more embodiments or elements thereof can be implemented in the form of means for carrying out one or more of the method steps described herein; the means can include (i) hardware module(s), (ii) software module(s) stored in a computer readable storage medium (or multiple such media) and implemented on a hardware processor, or (iii) a combination of (i) and (ii); any of (i)-(iii) implement the specific techniques set forth herein.

Techniques as disclosed herein can provide substantial beneficial technical effects. By way of example only and without limitation, one or more embodiments may provide one or more of the following advantages:

Operational benefits of VTFETs;
Protection against possible impairment of device function resulting from deposition of a nitride encapsulation layer;
Enhanced reliability.

These and other features and advantages will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of the present disclosure will be described herein in the context of illustrative embodiments. Moreover, it will become apparent to those skilled in the art given the teachings herein that numerous modifications can be made to the embodiments shown that are within the scope of the claims. That is, no limitations with respect to the embodiments shown and described herein are intended or should be inferred.

Figure 1A:
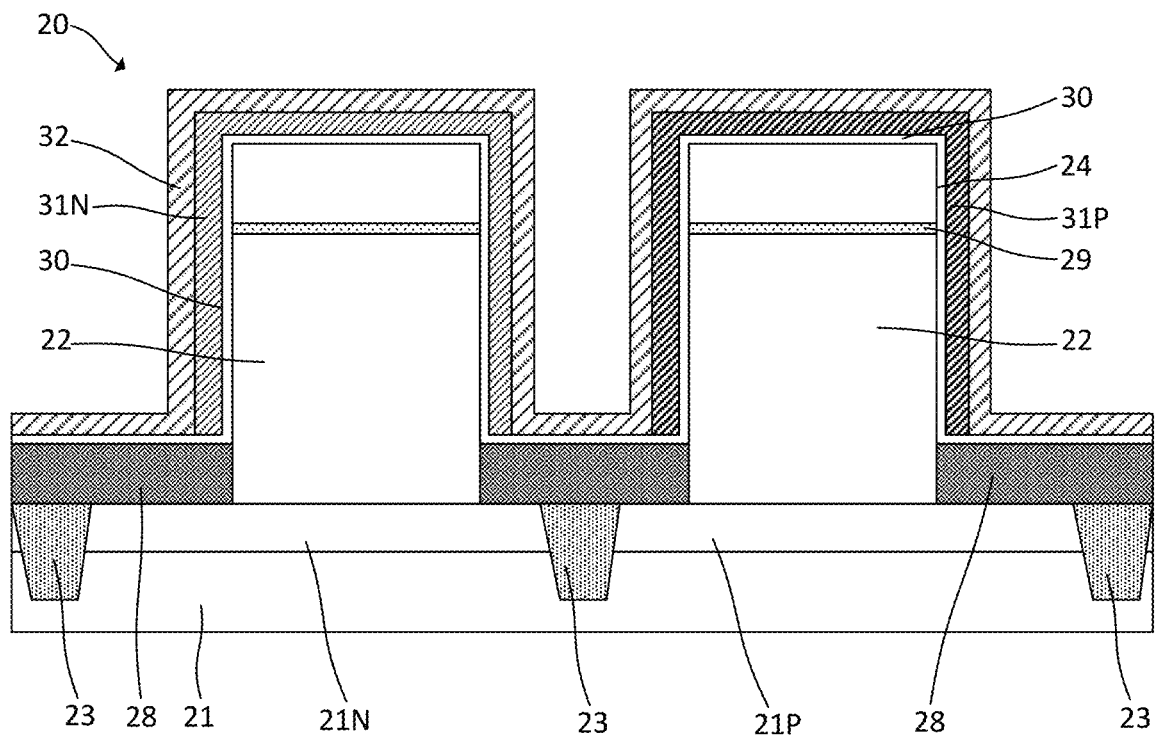
FIG. 1A is a schematic, cross-sectional illustration showing a stage of an exemplary process flow including a structure having nFET and pFET regions, each region including a partially completed vertical transport field-effect transistor (VTFET), and a common metal layer formed over both regions.

A structure 20 including a bulk semiconductor substrate 21 comprised of crystalline silicon and including nFET and pFET regions is shown in FIG. 1A. The substrate may be in the form of a wafer that is essentially undoped, but may contain some impurities. An array of parallel fins 22 is formed from the substrate using, for example, a sidewall image transfer process. A hard mask (not shown) may be deposited over the substrate, including any features thereon, using conventional deposition techniques such as spin-on coating, CVD, plasma-assisted CVD, or other known techniques. The fins 22 are formed beneath portions of the hard mask that remain on the structure following mask patterning. Semiconductor fins 22 extending vertically with respect to the substrate are formed following partial removal of substrate material by an etching process such as a reactive ion etch (RIE). Sacrificial dielectric caps 24 on the top surfaces of the fins 22 are the remaining portions of the hard mask (HM). Fin heights are preferably equal. Fin heights, widths and spacing are further chosen in accordance with manufacturer preferences. Fin heights in some embodiments range between 10-50 nm. The substrate in one exemplary embodiment is a (100) substrate oriented such that the side walls of the mono-crystalline silicon fins 22 are (110) surfaces. The side walls of the fins 22 may not be exactly vertical. Surfaces described as (110) surfaces herein are at least close to being (110) surfaces but may or may not be exactly (110) surfaces.

Doping of the substrate 21 is sufficient to enable its later use as bottom source/drain regions 21N, 21P of vertical transport field-effect transistors (VTFETs). In an exemplary embodiment, nFET regions of the substrate 21 are doped with an n-type dopant such as phosphorus or arsenic that provides n-type conductivity. As used herein, the term "conductivity type" denotes a dopant region being p-type or n-type. As used herein, "p-type" refers to the addition of impurities to an intrinsic semiconductor that creates deficiencies of valence electrons. In a silicon-containing substrate, examples of p-type dopants, i.e., impurities include but are not limited to: boron, aluminum, gallium and indium. As used herein, "n-type" refers to the addition of impurities that contributes free electrons to an intrinsic semiconductor. Examples of n-type dopants, i.e., impurities in a silicon-containing substrate include but are not limited to antimony, arsenic and phosphorous. The dopant implanted in the nFET regions of the substrate 21 may, for example, be phosphorus in a concentration in the range of $1-5 \times 10^{21}$ cm$^{-3}$ or 2-10 atomic % of phosphorus in Si. Various techniques can be employed to incorporate dopants in semiconductors, including implantation and diffusion. Alternatively, a heavily doped source/drain layer can be formed by epitaxial growth on the substrate 21 and/or bottom regions of the semiconductor fins 22. The nFET and pFET regions are electrically isolated by shallow trench isolation regions 23 extending through the source/drain regions 21N, 21P and into the essentially undoped or lightly doped region of the substrate 21.

It will be appreciated that substrate 21 and fins formed therefrom may include one or more semiconductor materials. Non-limiting examples of suitable substrate materials include Si (silicon), strained Si, SiC (silicon carbide), Ge (germanium), SiGe (silicon germanium), SiGeC (silicon-germanium-carbon), Si alloys, Ge alloys, III-V materials (e.g., GaAs (gallium arsenide), InAs (indium arsenide), InP (indium phosphide), or aluminum arsenide (AlAs)), II-VI materials (e.g., CdSe (cadmium selenide), CdS (cadmium sulfide), CdTe (cadmium telluride), ZnO (zinc oxide), ZnSe (zinc selenide), ZnS (zinc sulfide), or ZnTe (zinc telluride)), or any combination thereof. Vertical transport devices can alternatively be formed on a semiconductor-on-insulator (SOI) substrate including a buried insulator layer.

A bottom spacer 28 is deposited over the bottom source/drain regions 21N, 21P. The bottom spacer may comprise an electrically insulating material, for example, silicon dioxide, silicon nitride, SiOCN, or SiBCN. Other non-limiting examples of materials for the bottom spacer include dielectric oxides (e.g., silicon oxide), dielectric nitrides (e.g., silicon nitride), dielectric oxynitrides, or any combination thereof. The bottom spacer may have a thickness of about five to about ten nanometers, though such a range is not considered critical. The bottom spacer 28 can be deposited directly on the bottom source/drain layer regions 21N, 21P using directional (bottom thick, non-conformal) deposition techniques including, but not necessarily limited to high density plasma (HDP) deposition, physical vapor deposition (PVD) and gas cluster ion beam (GCM) deposition, or conformal deposition techniques including, but not limited to, chemical vapor deposition (CVD), plasma enhanced CVD (PECVD), radio-frequency CVD (RFCVD), atomic layer deposition (ALD), molecular layer deposition (MLD), molecular beam deposition (MBD), and pulsed laser deposition (PLD). The monolithic structure 20 further includes a top dielectric layer 29 between the top surfaces of the fins 22 and the bottom surfaces of the dielectric caps 24. In one or more exemplary embodiments, the top dielectric layer 29 is a silicon dioxide layer and the dielectric caps 24 are silicon nitride caps.

A gate dielectric layer 30 and a work function metal (WFM) layer are deposited sequentially to form a gate stack for the VTFET devices. The gate dielectric layer adjoins the sidewalls of the semiconductor fins 22 and the dielectric caps 24 on the fins. Non-limiting examples of suitable materials for the gate dielectric layer 30 include oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum. The gate dielectric layer 30 may be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the gate dielectric material may vary depending on the deposition process as well as the composition and number of high-k dielectric materials used. In some embodiments, the gate dielectric layer includes multiple layers.

Work function metal (WFM) layers are disposed over the gate dielectric layer in both the nFET and pFET regions. Non-limiting examples of suitable work function metals include p-type work function metal materials and n-type work function metal materials. P-type work function materials include compositions such as ruthenium, palladium, platinum, cobalt, nickel, and conductive metal nitride like TiN, WN, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof. The work function metal(s) may be deposited by a suitable deposition process, for example, ALD CVD, PECVD, PVD, plating, thermal or e-beam evaporation, and sputtering. The WFM layer is removed from one of the nFET and pFET regions while the other region is protected. An SC1 etch, an SC2 etch or other suitable etch processes can be employed to remove the selected portion of the originally deposited WFM layer. A new WFM layer suitable for the region is then deposited. A device formed in the nFET region will accordingly include a WFM layer 31N having a first composition while a device in the pFET region will have a WFM layer 31P having a second composition. For example, the WFM employed in the nFET region may be a Ti, Al, TiAl, TiAlC or TiAlC layer or a metal stack such as TiN/TiAl/TiN, TiN/TiAlC/TiN, TiN/TaAlC/TiN, or any combination of an aluminum alloy and TiN layers. The WFM layer employed in the pFET region may, for example, be a TiN, TiC, TaN or a tungsten (W) layer.

A common metal layer 32 is formed on the WFM layers 31N, 31P and extends horizontally over the n/p boundary. The common metal layer 32 can be a pure metal layer, a metal alloy layer, or a metal stack that can be used as an electrical conductor. A TiN or W layer having a thickness between two and ten nanometers (2-10 nm) may, for example, be deposited. The common metal layer and the WFM layers form the gate metal of the VTFETs to be fabricated.

Figure 1B:
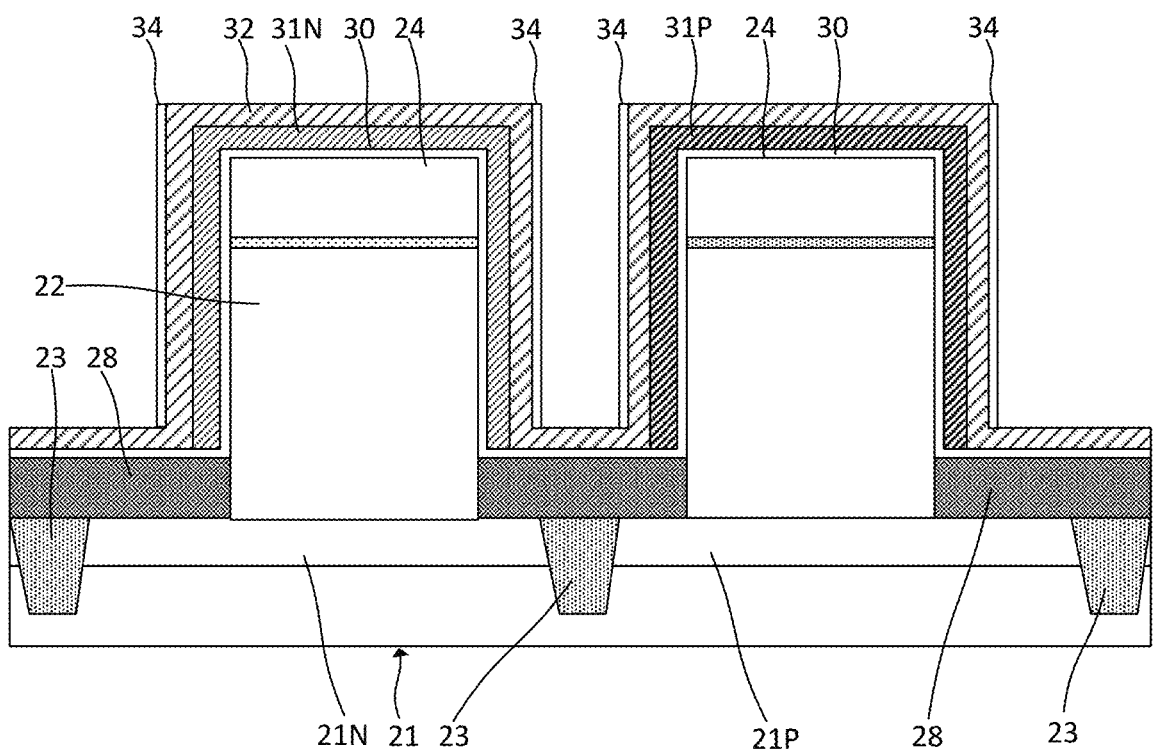
FIG. 1B is a sectional view showing the structure of FIG. 1A following deposition of a conformal film thereon and formation of vertically extending sidewall spacers from the conformal film on the common metal layer.

The threshold voltage (Vt) of nFET devices is sensitive to the thickness of work function metals such as titanium nitride (TiN). The deposition of encapsulation layers comprising silicon nitride, for example, could nitridize or oxidize the work function metal 31N in this region and thereby adversely affect device performance. Referring to FIG. 1B, spacers 34 configured to reduce or prevent nitridation or oxidation are formed on the sidewalls of the common metal layer 32. A thin amorphous silicon film may be conformally deposited by CVD, ALD, plasma-enhanced chemical vapor deposition (PECVD) although other techniques such as hot-wire chemical vapor deposition (HWCVD) may be used to form an amorphous silicon (a-Si) film. The film used to form the spacers may have an average thickness of a few nanometers (with a most practical range of about 2-5 nm) and is continuous (without gaps). Conformal amorphous silicon films as employed in an exemplary process may be deposited at a deposition temperature in the range of 385-450° C. at a deposition rate between four and forty angstroms per minute. Deposition temperatures of 400° C. or less are preferred. In some embodiments, the density of the amorphous silicon film is about 2.2 g/cm$^3$ and the hydrogen content of the film is nine percent or less. The amorphous film may or may not be entirely amorphous and may contain, for example, polycrystalline and/or microcrystalline regions within the otherwise predominantly amorphous film that do not affect film continuity.

In addition to silicon, as discussed above, the amorphous film used to form spacers 34 may include other elements. An amorphous, undoped silicon carbide (SiC) film may be conformally deposited in some embodiments to form the layer used to form the spacers 34. Other materials such as conformal, amorphous SiGe or Ge deposited at relatively low temperature (<about 400° C.) could alternatively be employed. Such films can be deposited using atomic layer deposition (ALD), chemical vapor deposition (CVD), plasma-enhanced chemical vapor deposition (PECVD), or any other suitable deposition method that provides conformal surface deposition at low temperature. While there may be some variation in film thickness on the horizontal and vertical surfaces of the structure, the film conforms to the surface of the structures on which it is deposited and there is film continuity over the metal surfaces such that they are effectively covered and protected by the deposited film. Methods of conformally depositing continuous amorphous silicon and silicon carbide films are known to the art and continue to be developed.

The conformally deposited film is subjected to a reactive ion etch (RIE) to form the sidewall spacers 34 on the vertical surfaces of the common metal layer 32. The horizontal surfaces of the common metal layer 32 are exposed following RIE. The vertical surfaces of the common metal layer 32 remain covered by the sidewall spacers 34 formed from the conformal film, as schematically illustrate in FIG. 1B.

Figure 1C:
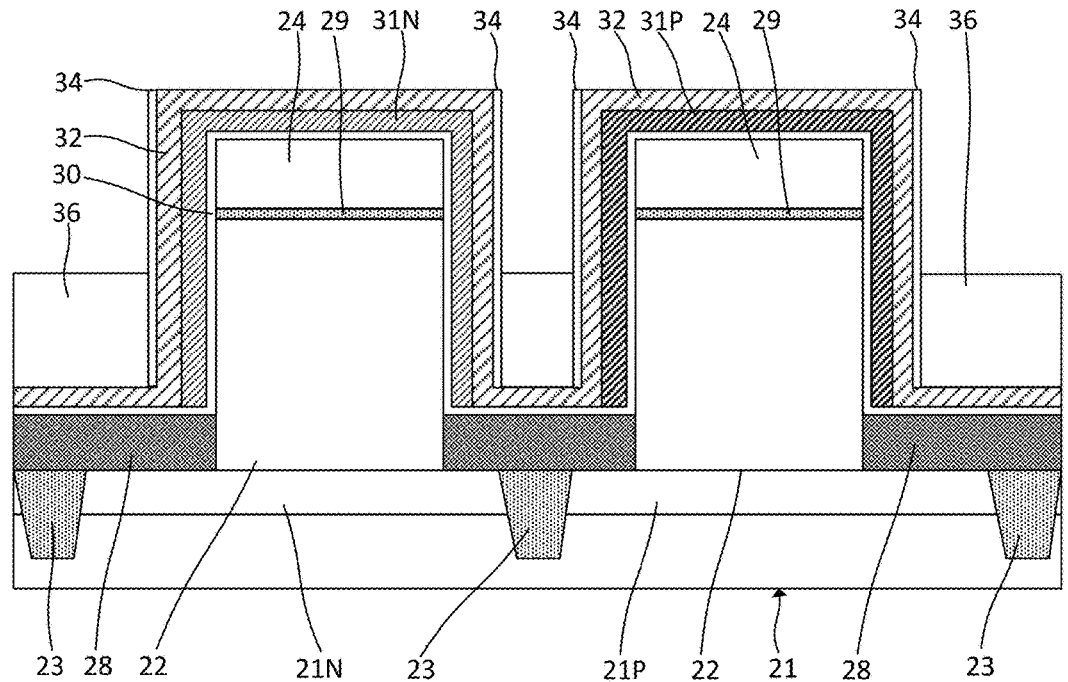
FIG. 1C is a sectional view showing the structure of FIG. 1B following deposition of a planarization layer thereon and recessing of the planarization layer.

A planarization layer 36 is deposited on the monolithic structure and recessed. An organic planarization layer (OPL) may, for example, be deposited and etched back using a wet etch or a dry etch. The planarization layer may alternatively be an oxide layer. As shown in FIG. 1C, the planarization layer covers the portions of the sidewall spacers 34 that are formed over the channel regions of the semiconductor fins 22. The top portions of the sidewall spacers 34 are exposed following recessing. An additional protective layer (not shown) such as a silicon nitride layer may be formed on the sidewall spacer 34

Figure 1D:
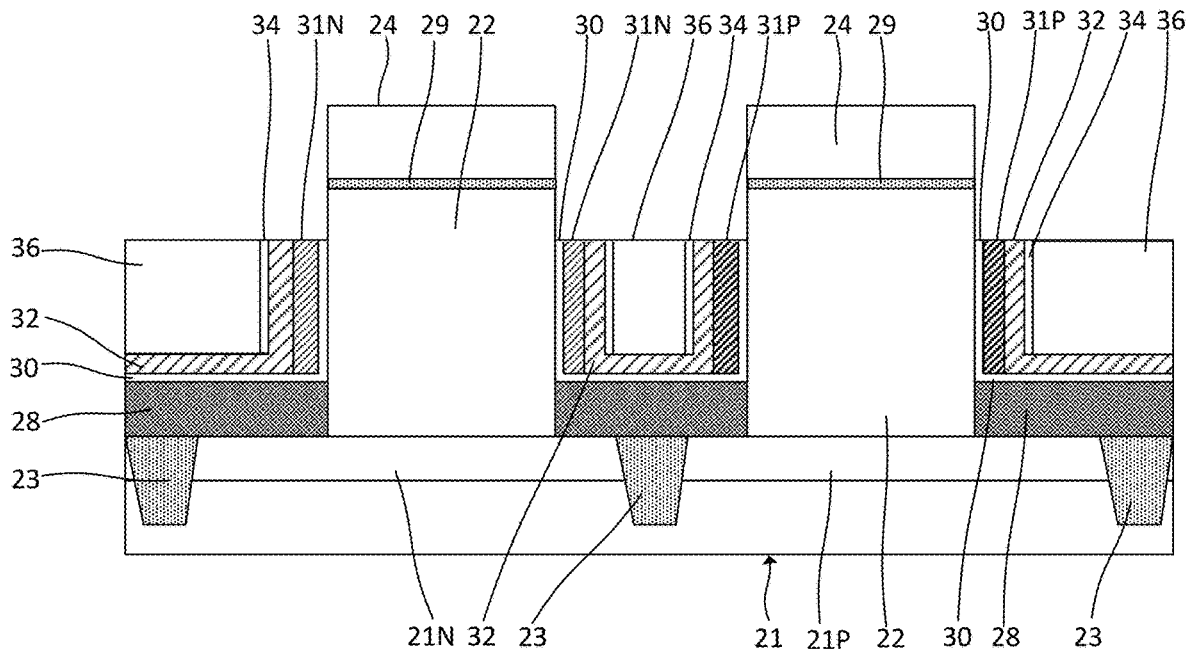
FIG. 1D is a sectional view showing the structure of FIG. 1C following removal of portions of the structure above the recessed planarization layer.

The exposed portions of the spacers 34, the common metal layer 32, the WFM layers 31N, 31P and the gate dielectric layer 30 are removed to obtain a structure 40 as schematically illustrated in FIG. 1D. Sequential wet or dry etches may be employed to remove the portions of these layers above the top surfaces of the planarization layer 36. The etches may be timed to minimize undercutting beneath the top surfaces of the planarization layer. The channel regions of the semiconductor fins 22 remain surrounded by gate dielectric layers 30, work function metal (WFM) layers 31N, 31P, the common metal layer 32, and the silicon-based spacers 34.

Figure 1E:
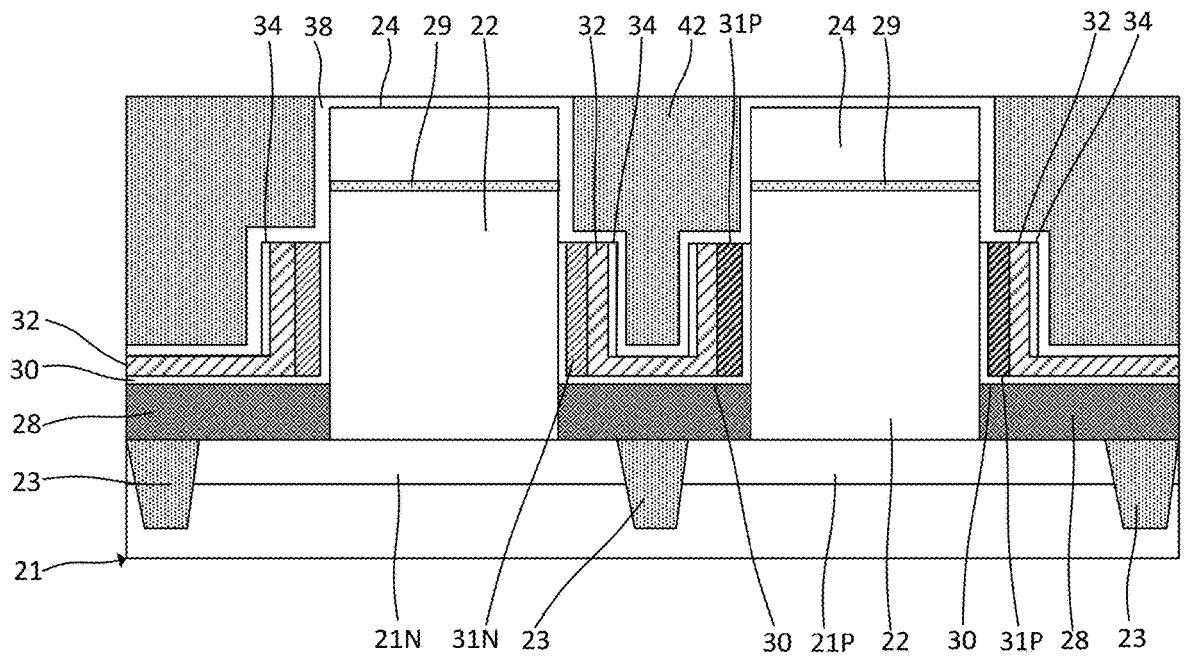
FIG. 1E is a sectional view showing the structure of FIG. 1D following removal of the recessed planarization layer, deposition of a dielectric gate encapsulation layer, deposition of a fill layer over the dielectric gate encapsulation layer, and planarization of the fill layer.

If the planarization layer 36 is an OPL layer, it is removed from the structure 40. An oxide planarization layer, if employed, does not require removal. Referring to FIG. 1E, a dielectric gate encapsulation layer 38 is conformally deposited on the structure following removal of the planarization layer. The gate encapsulation layer may be a silicon nitride layer and extends over both the nFET and pFET regions as well as the n/p boundary. The encapsulation layer adjoins only the top surfaces of the WFM layers 31N, 31P and the common metal layer 32. Amorphous silicon or silicon carbide spacers 34 prevent direct contact of the gate encapsulation layer 38 with the much more extensive vertical surfaces of the common metal layer 32 and much of the nitridation/oxidation of the metal layers that would otherwise be possible. A silicon nitride gate encapsulation layer may be deposited by atomic layer deposition (ALD). Residual oxygen in the SiN source could, in the absence of the spacers 34, cause damage or oxidation to the WFM layer and/or other underlying layers during deposition. Oxidation damage with SiN deposition may arise because the deposition of a 100% SiN film has been infeasible. The spacers 34 further inhibit the nitridation of the WFM layer 31N and common metal layer 32. SiON (silicon oxynitride), SiBCN (silicon borocarbonitride), SiOCN (silicon oxycarbonitride), or SiOC (silicon oxycarbide), can alternatively be used to form the dielectric gate encapsulation layer 38 without causing significant nitridation or oxidation of the underlying materials due to the presence of the spacers 34.

A fill layer 42 is deposited over the nFET and pFET regions and planarized to obtain a structure as schematically illustrated in FIG. 1E. The fill layer may, for example, be deposited using flowable chemical vapor deposition (FCVD). Spin-on dielectrics (SOD) may alternatively be deposited. A gap-filling silicon dioxide layer is deposited in some embodiments. High-density plasma (HDP) CVD or related technology may further be employed to facilitate the gap-fill process. In HDP CVD, the gaps and voids are filled from the walls of a device. The gap fill could be entirely FCVD oxide and/or SOD or alternatively FCVD oxide followed by oxide recess and then filled by HDP oxide to provide better wet etch resistance. The fill layer 42 is recessed down to the top surfaces of the encapsulation layer 38. A chemical mechanical planarization (CMP) process may be employed for such recessing.

One region of the resulting structure is masked while the layers above the semiconductor fins 22 in the other region are removed. In an exemplary embodiment, the pFET region is masked (not shown) while the nFET region is exposed. The layers 38, 24, 29 above the top surfaces of the silicon fins 22 in the nFET region are removed.

Top source/drain regions 221N are epitaxially grown on the exposed surfaces of the top region of the semiconductor fins 22 in the nFET region. The epitaxially grown source/drain layer 221N can be doped in situ, and dopants may include, for example, an n-type dopant selected from a group of phosphorus (P), arsenic (As) and antimony (Sb). In a non-limiting example, a dopant concentration range may be e20/cm$^3$ to e21/cm$^3$, with 4e20/cm$^3$ to 8e20/cm$^3$ preferred.

The terms "epitaxial growth and/or deposition" and "epitaxially formed and/or grown," mean the growth of a semiconductor material (crystalline material) on a deposition surface of another semiconductor material (crystalline material), in which the semiconductor material being grown (crystalline over layer) has substantially the same crystalline characteristics as the semiconductor material of the deposition surface (seed material). In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed.

The epitaxial deposition process may employ the deposition chamber of a chemical vapor deposition type apparatus, such as a low pressure chemical vapor deposition (LPCVD) apparatus. A number of different precursors may be used for the epitaxial deposition of the in situ doped semiconductor material. In some embodiments, the gas source for the deposition of an epitaxially formed in situ doped semiconductor material may include silicon (Si) deposited from silane, disilane, trisilane, tetrasilane, hexachlorodisilane, tetrachlorosilane, dichlorosilane, trichlorosilane, disilane and combinations thereof. In other examples, when the in situ doped semiconductor material includes germanium, a germanium gas source may be selected from the group consisting of germane, digermane, halogermane, dichlorogermane, trichlorogermane, tetrachlorogermane and combinations thereof. Examples of other epitaxial growth processes that can be employed in growing semiconductor layers described herein include rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). By "in-situ" it is meant that the dopant that dictates the conductivity type of doped layer is introduced during the process step, for example epitaxial deposition, that forms the doped layer.

Figure 1F:
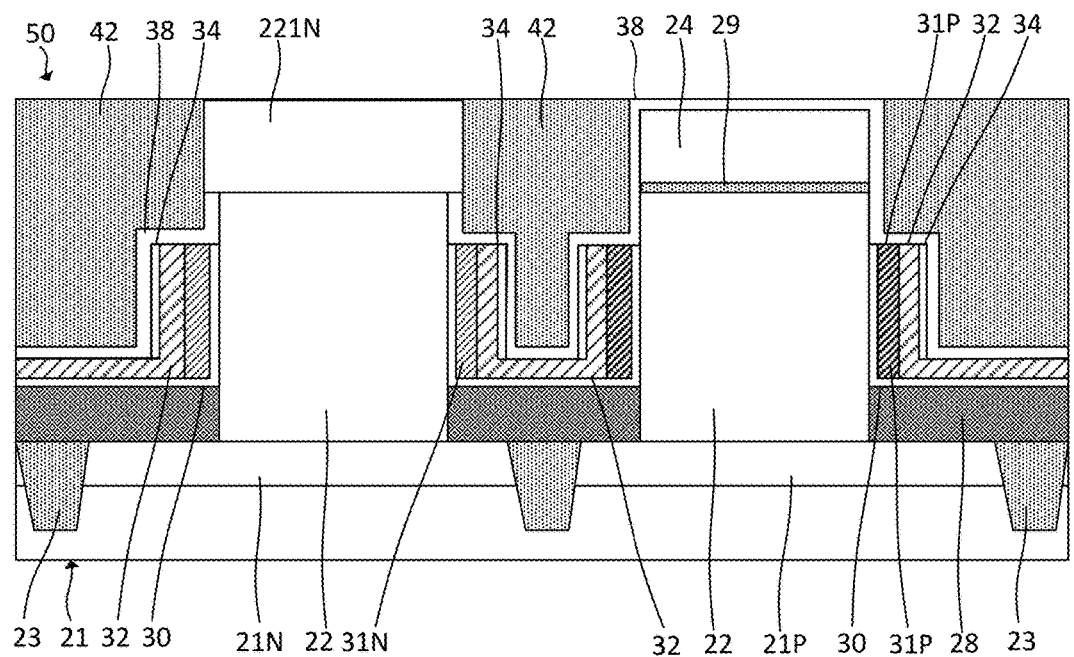
FIG. 1F is a sectional view showing the structure of FIG. 1E following growth of a top source/drain region in the nFET region.
Figure 1G:
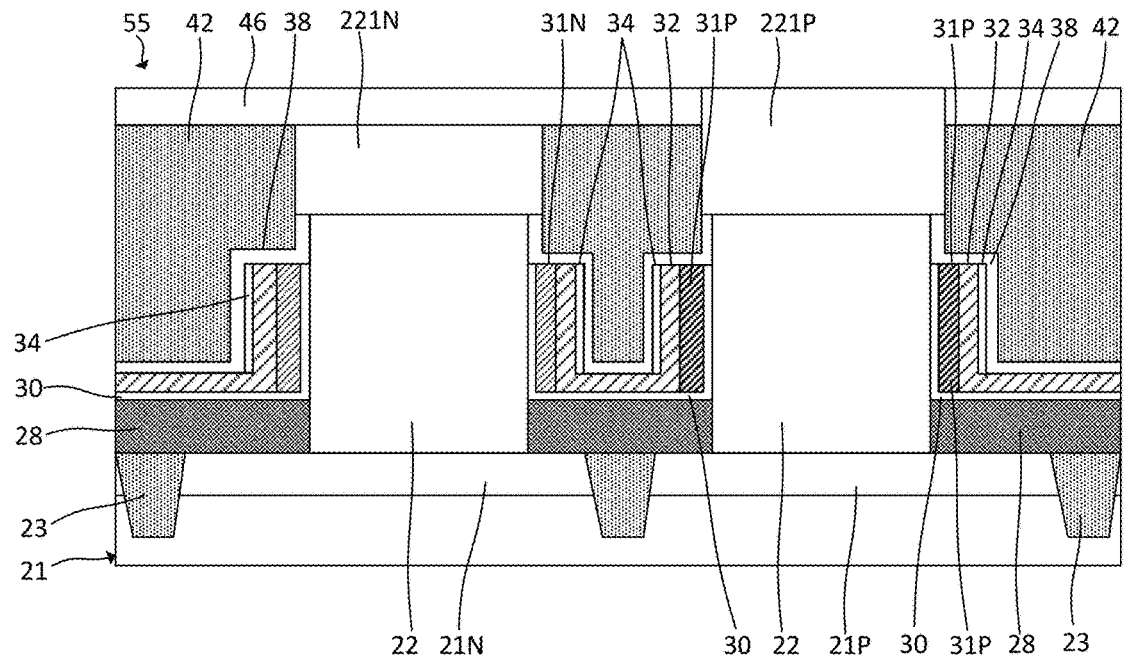
FIG. 1G is a sectional view showing the structure of FIG. 1F following growth of a top source/drain region in the pFET region.

FIG. 1F schematically illustrates an exemplary monolithic structure 50 following growth of the top source/drain regions 221N in the nFET region. Such growth occurs on the top surfaces of the semiconductor fins 22 in the nFET region and within recesses formed in the fill layer 42. Top source/drain regions 221P are formed in the pFET region in a similar manner. A protective liner 46 may be formed over the structure 50 and the layers directly above the semiconductor fins 22 in the nFET region. Following exposure of the top surfaces of the fins 22 in the pFET region, the top source/drain regions 221P are epitaxially grown. The top source/drain regions 221P of the transistors formed in the pFET region include a p-type dopant selected, for example, from a group of boron (B), gallium (Ga), indium (In), and thallium (Tl) at various concentrations. In some embodiments, the top source/drain regions 221P comprise silicon germanium. The temperature for epitaxial silicon germanium deposition typically ranges from 450° C. to 900° C. Although higher temperature typically results in faster deposition, the faster deposition may result in crystal defects and film cracking. FIG. 1G includes a schematic illustration of an exemplary monolithic structure 55 following epitaxial source/drain growth in the pFET region.

An interlevel dielectric (ILD) layer 52 is deposited on the structure 55 followed by a CMP process. The SiN liner 46 protects the top S/D regions 221N from oxidation during ILD deposition. Additional liner material (not shown) could be deposited to also cover the top S/D regions 221P in the pFET region. The liner 46 can also function as an etch stop layer (due to the etch selectivity of SiN over $SiO_2$) when top S/D metal contact trenches are formed in the ILD layer 52. The SiN liner 46 on the top source/drain regions can be removed selectively before silicide formation and contact metal fill.

Figure 1H:
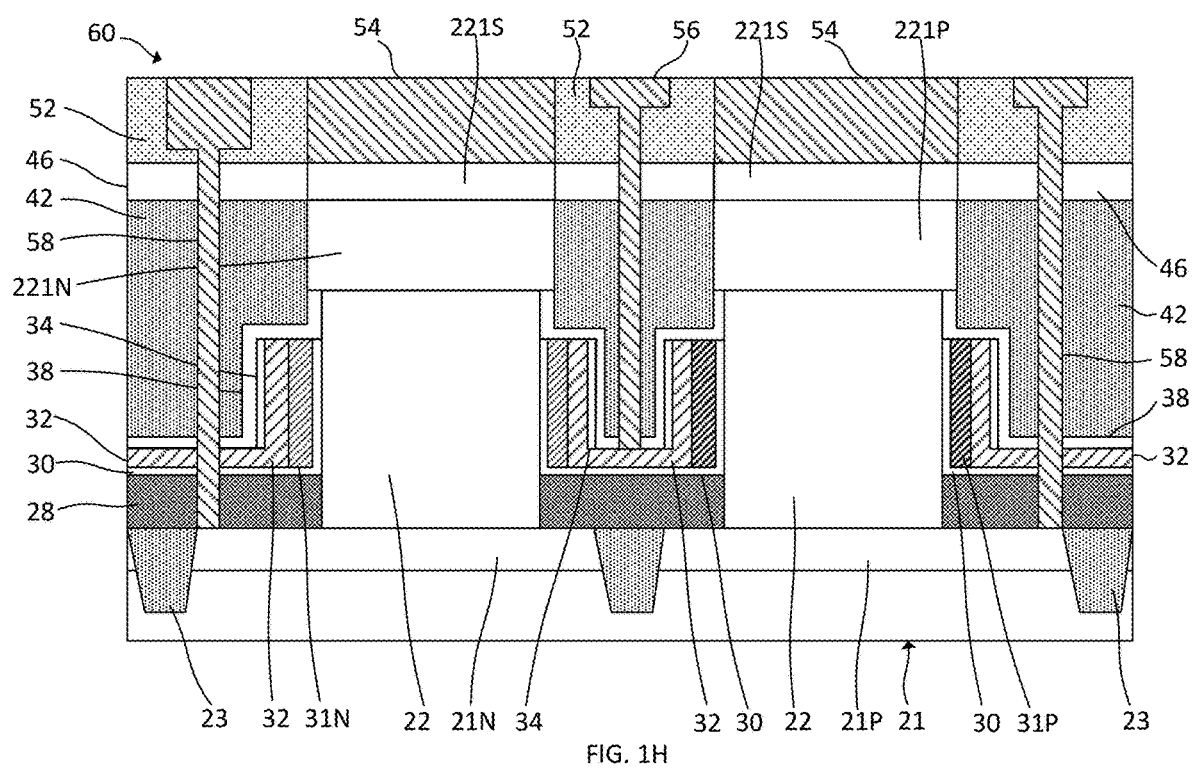
FIG. 1H is a sectional view showing the structure of FIG. 1G following deposition of an interlevel dielectric layer and formation of via conductors and contacts.

Trenches are formed in the ILD layer 52. Vias are formed between some of the trenches and selected regions of the structure 55. Referring to FIG. 1H, two of the trenches extend down to the top source/drain regions 221N, 221P of the nFET and pFET devices, respectively. One via is shown extending between a trench in the ILD layer 52 and the common metal layer 32. Two vias are shown extending between trenches and the bottom source/drain regions 21N, 21P of the nFET and pFET devices, respectively. Top source/drain contacts 54 are formed using suitable metallization processes. In one or more embodiments, an electrically conductive metal such as nickel, nickel platinum, or titanium is deposited on the top source/drain regions 26B. Electroless deposition processes and atomic layer deposition (ALD) are among the techniques that may be employed. Metal deposition may be followed by low temperature silicidation to form metal silicide or metal germanide layers 221S on the top source/drain regions 221N, 221P. Annealing temperatures between 300-420° C. form uniform layers of metal-rich silicides. Annealing could be performed using a laser spike anneal in the range of 700° C. to 1100° C. in some embodiments. A contact metal layer, for example tungsten (W) or cobalt (Co), is deposited on the structure, filling the trenches formed the ILD layer and directly contacting the metal silicide layers 221S formed on the top source/drain regions 221N, 221P. In some embodiments, the contact metal layer is a tungsten (W) layer that is deposited using a tungsten hexafluoride source with silane. Chemical vapor deposition conducted between 300-400° C. and using tungsten hexafluoride precursor chemistry may, for example, be employed to deposit a tungsten layer. Contact material may, for example, alternatively include tantalum (Ta), aluminum (Al), platinum (Pt), gold (Au), titanium (Ti), palladium (Pd) or any combination thereof. The contact material may be deposited by, for example, CVD, PECVD, PVD, plating, thermal or e-beam evaporation, or sputtering. A planarization process such as CMP is performed to remove any electrically conductive material (overburden) from the top surface of the structure. Gate and bottom source/drain via conductors and contacts 56, 58 are also formed within the structure following trench and via formation. A monolithic structure 60 as schematically illustrated in FIG. 1H may be obtained following transistor wiring.

The electronic devices comprising the structure 60 shown in FIG. 1H may be incorporated within electronic circuitry that, in one or more exemplary embodiments, comprises an integrated circuit (IC). In other words, the electronic circuitry may include an assembly of electronic components, fabricated as a monolithic unit, in which active and passive devices and their interconnections are formed. The resulting circuit may perform one or more functions (e.g. logic, memory, sensing) depending on the arrangement of the components.

Figure 2A:
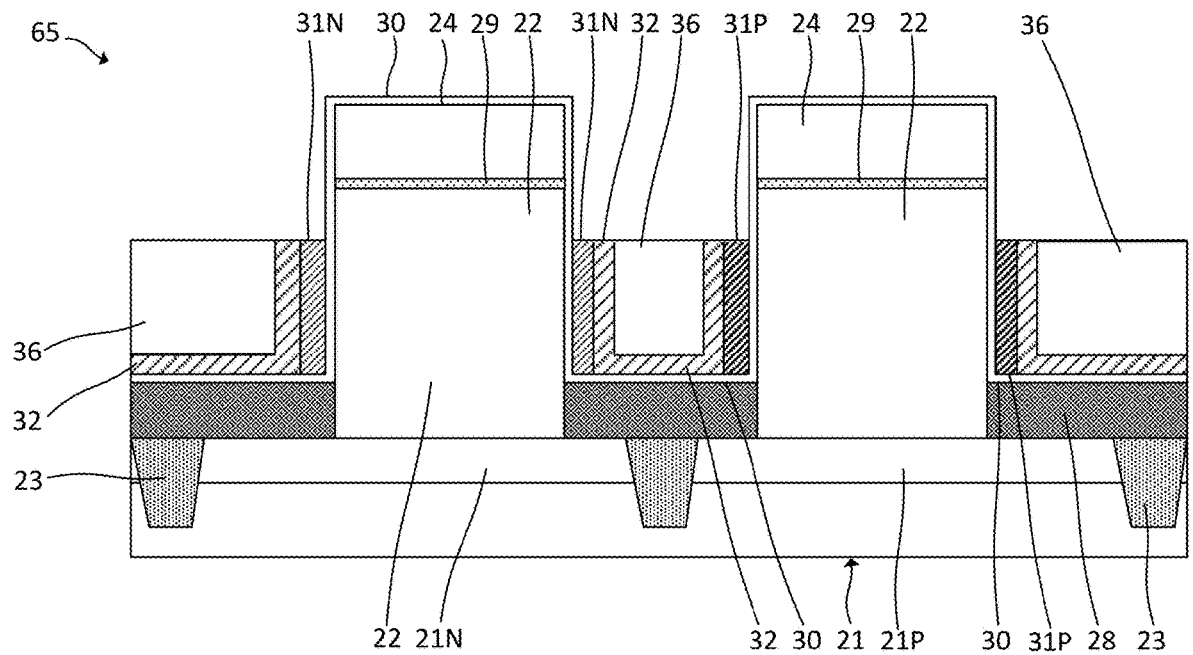
FIG. 2A is a schematic, cross-sectional illustration showing a process stage of a second exemplary process flow for fabricating a monolithic VTFET structure that includes an nFET region and a pFET region, each of the regions including a partially completed VTFET, a common metal layer extending between the nFET and pFET regions, and a sacrificial layer.

An alternative method of encapsulating the gate stacks of VTFETs is schematically illustrated in FIGS. 2A-2E. The same reference numerals are employed with respect to the alternative method as are used above to designate the same or similar elements. The alternative method, like the method described above, includes deposition of a common metal layer 32 as schematically illustrated in FIG. 1A. A sacrificial layer 36, such as an OPL or oxide layer, is deposited on the structure and recessed. The sacrificial layer 36 adjoins the common metal layer 32 as schematically illustrated in FIG. 2A. The portions of the WFM layers 31N, 31P and the common metal layer 32 above the top surface of the recessed sacrificial layer 36 are removed to obtain a structure 65 as shown in FIG. 2A. The gate dielectric layer 30 remains intact at this stage of the process.

Figure 2B:
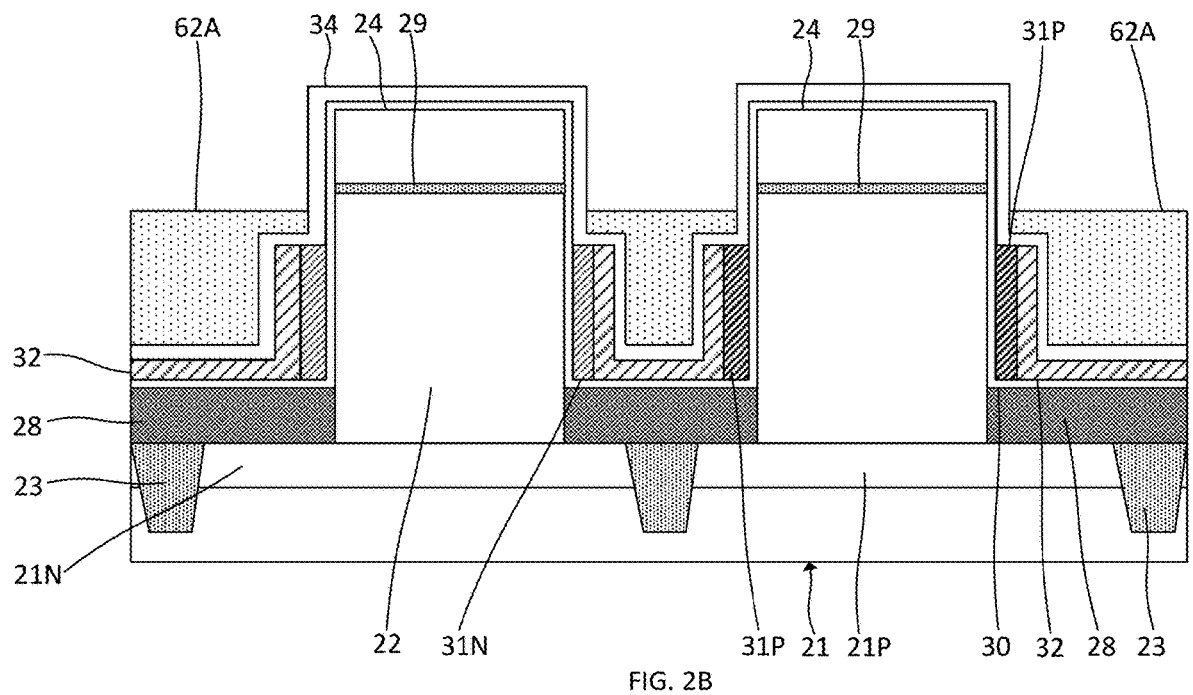
FIG. 2B is a sectional view showing the structure of FIG. 2A following removal of the sacrificial layer, deposition of a conformal, amorphous layer, and deposition of a bottom fill layer.
Figure 2C:
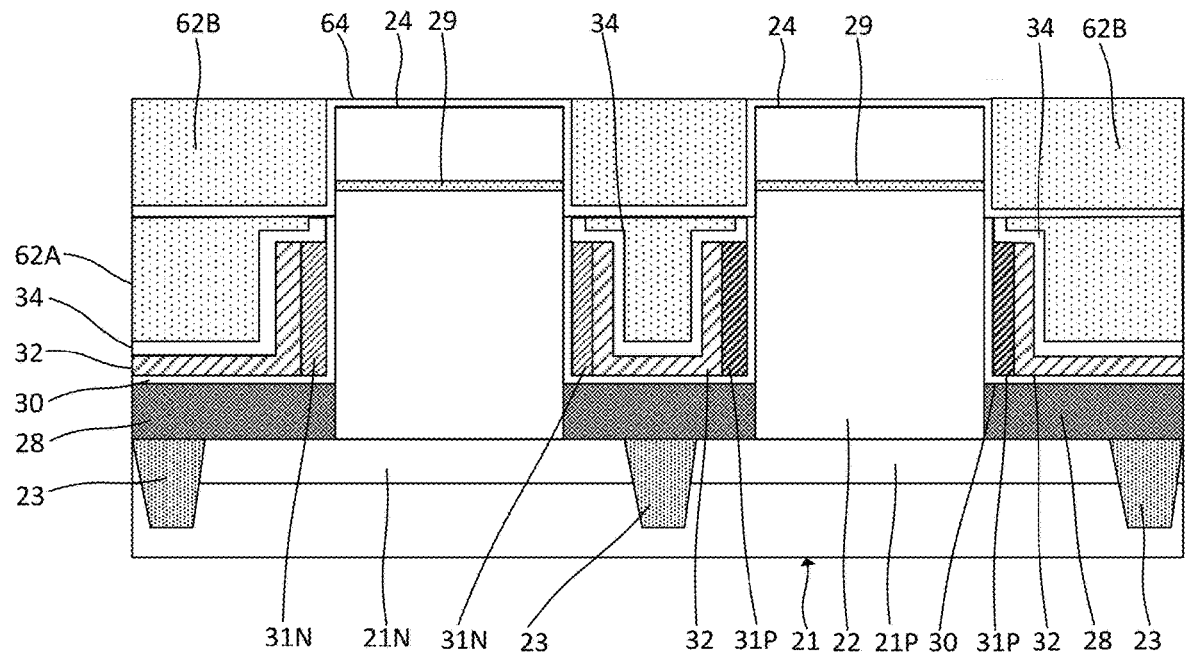
FIG. 2C is a sectional view showing the structure of FIG. 2B following removal of portions of the conformal, amorphous layer and the gate dielectric layer and the deposition of a dielectric liner and a top fill layer.

The sacrificial layer 36 is removed from the structure 65. Following such removal, a conformal amorphous silicon or silicon carbide layer 34 is deposited on the structure. (Numeral 34 is employed to designate both the originally deposited conformal layer and structures such as spacers formed from the conformal layer that protect underlying metal layers.) The conformal layer 34 adjoins portions of the gate dielectric layer 30, the WFM layers 31N, 31P, and the common metal layer 32 has a thickness of about three nanometers in some embodiments. The thickness of the conformal layer 34 should be sufficient to ensure film continuity. The gaps between nFET and pFET structures are then filled with a dielectric material such as a flowable oxide or other suitable material. The fill material is recessed to expose the top portions of the nFET and pFET structures, including the portions of the conformal layer 34 over the dielectric caps 24. The portions of the conformal layer 34 extending over the top surfaces of the WFM layers 31N, 31P and the common metal layer 32 remain encapsulated by fill material. The recessed fill material forms a bottom fill layer 62A, as shown in FIG. 2B.

The portions of the conformal layer 34 and gate dielectric layer 30 above the top surface of the bottom fill layer 62A are removed in sequence. The dielectric caps 24 on each of the nFET and pFET structures are exposed following such removal. A liner 64 is then conformally deposited on the structure and adjoins the dielectric caps 24 and the top surfaces of the fill layer 62A. In some embodiments, the liner 64 is comprised of silicon nitride. SiON (silicon oxynitride), SiBCN (silicon borocarbonitride), SiOCN (silicon oxycarbonitride) or SiOC (silicon oxycarbide), may alternatively be employed as liner materials. A top fill layer 62B, which may have the same composition as the bottom fill layer 62A, is then deposited to obtain a structure a schematically illustrated in FIG. 2C. In this structure, the WFM is sealed by a-Si to protect the WFM/dielectric from the downstream process.

Figure 2D:
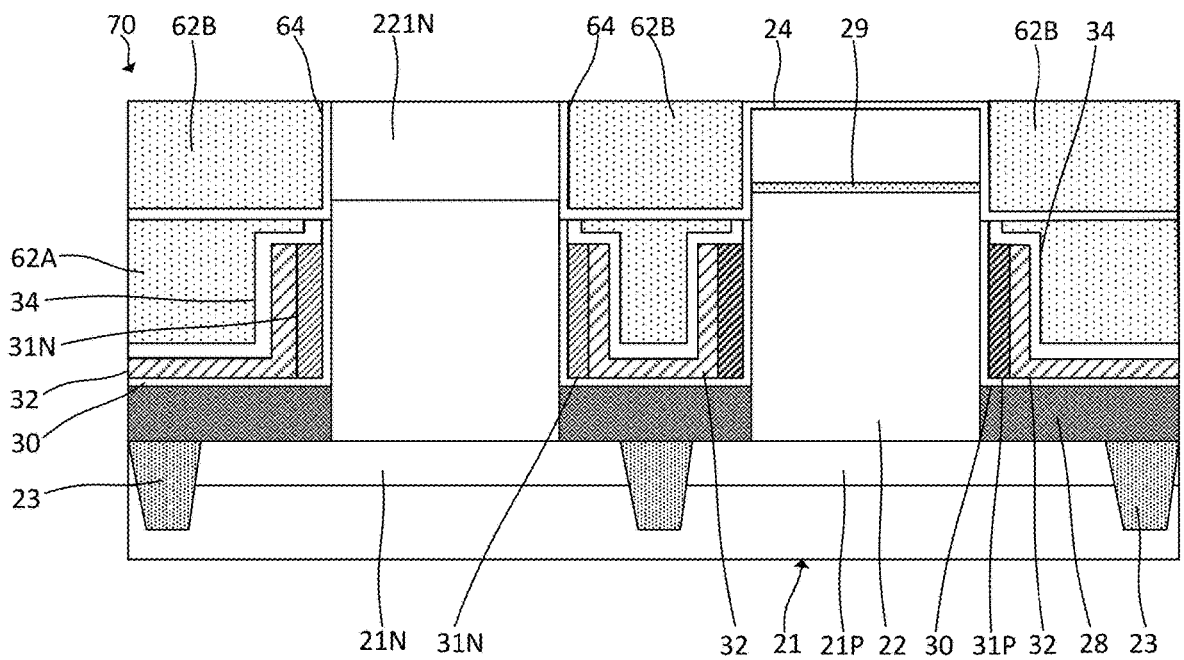
FIG. 2D is a sectional view showing the structure of FIG. 2C following removal of layers over a semiconductor fin in the nFET region and growth of a top source/drain region on the semiconductor fin in the nFET region.

The layers directly above the semiconductor fins 22 are removed to expose the top surfaces of the fins. In an exemplary embodiment, the layers over the fins 22 in the nFET region are removed first while those over the fins in the pFET region remain intact. Recesses within the top fill layer 62B are accordingly formed in the areas formerly containing the dielectric caps 24 and the oxide layer 29. The vertical portions of the liner 64 remain following formation of such recesses and comprise vertical spacers on the sidewalls of the top fill layer 62B. Source/drain regions 221N are epitaxially grown on the exposed top fin surfaces in the nFET region to obtain a monolithic structure 70 as schematically illustrated in FIG. 2D. Each source/drain region 221N is bounded by the vertical sidewall spacers formed by the liner 64.

Figure 2E:
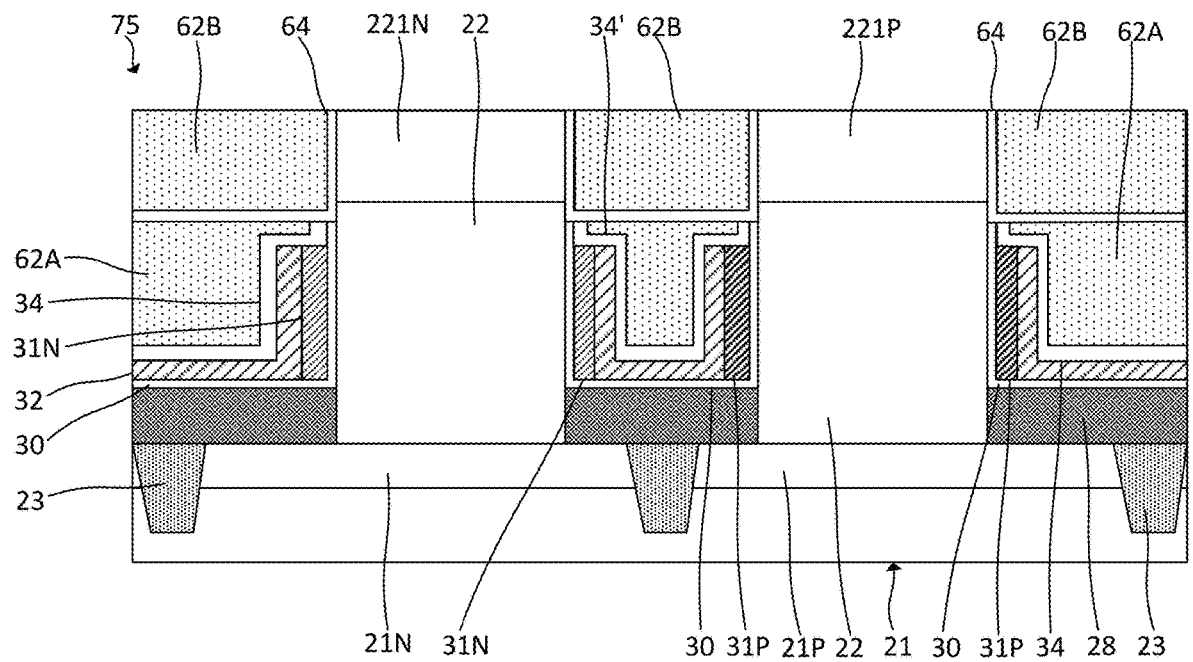
FIG. 2E is a sectional view showing the structure of FIG. 2D following removal of layers over a semiconductor fin in the pFET region and growth of a top source/drain region on the semiconductor fin in the pFET region.

Recesses are formed within the top fill layer 62B in the areas formerly containing the dielectric caps 24 and the oxide layer 29 in the pFET region of the structure. The vertical portions of the liner 64 remain following formation of such recesses and comprise vertical spacers on the sidewalls of the top fill layer 62B. Doped source/drain regions 221P having p-type conductivity are epitaxially grown on the exposed top fin surfaces in the pFET region to obtain a monolithic structure 75 as schematically illustrated in FIG. 2E. Gate and source/drain contacts and associated via conductors can later be formed within the structure 75 using techniques as discussed above.

Selected stages of a third exemplary process of fabricating VTFET structures are schematically illustrated in FIGS. 3A-3D. These stages follow fabrication of earlier-stage structures such as the structure 20 described above with respect to FIG. 1A. In this exemplary process, a conformal amorphous silicon or silicon carbide layer 34 is deposited over the common metal layer 32. The thickness of the conformal layer 34, like those described above, is sufficient to form a gap-free (continuous) film.

Figure 3A:
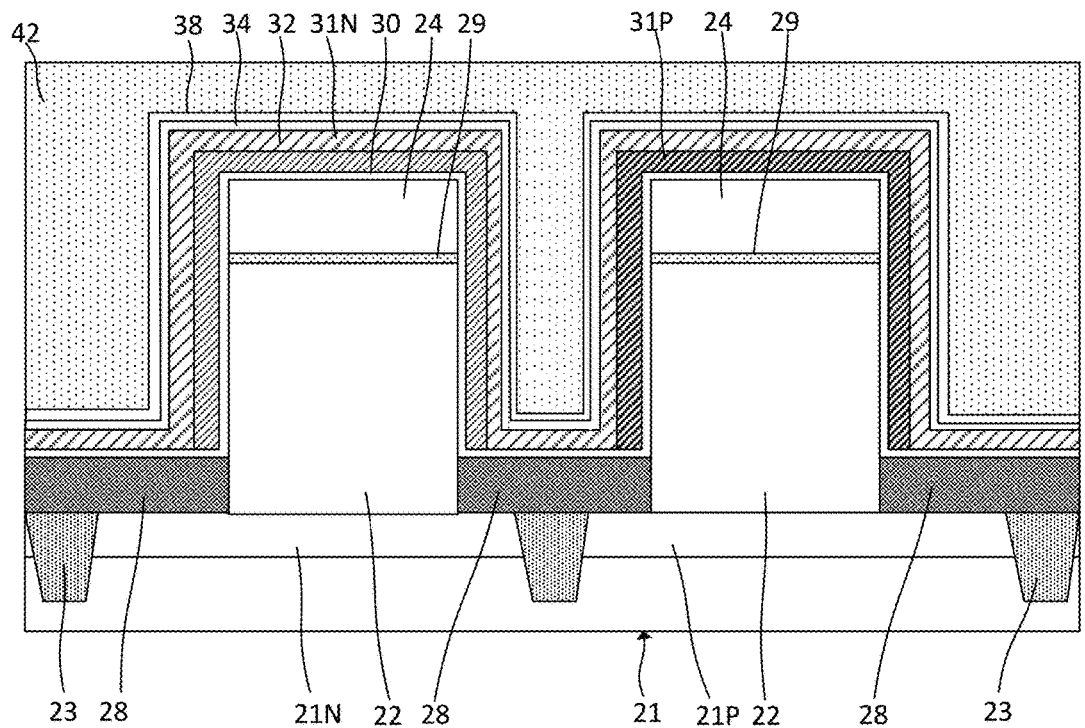
FIG. 3A is a schematic, cross-sectional illustration showing a process stage of a third exemplary process flow for fabricating a monolithic VTFET structure that includes an nFET region and a pFET region, each of the regions including a partially completed VTFET, a common metal layer, a conformal, amorphous layer over the common metal layer, a gate encapsulation layer over the conformal, amorphous layer, and a fill layer over the nFET and pFET regions.

A gate encapsulation layer 38 is conformally deposited over the amorphous silicon or silicon carbide layer 34. The gate encapsulation layer may, for example, comprise SiN, SiON (silicon oxynitride), SiBCN (silicon borocarbonitride), SiOCN (silicon oxycarbonitride), or SiOC (silicon oxycarbide). A fill layer 42 is deposited over the nFET and pFET regions and planarized to obtain a structure as schematically illustrated in FIG. 3A. The fill layer may, for example, be deposited using flowable chemical vapor deposition (FCVD). A gap-filling silicon dioxide layer is deposited in some embodiments over the gate encapsulation layer 38. The fill layer 42 and underlying layers 38, 34, 32, 30 are then subjected to chemical mechanical planarization (CMP), stopping at the top surfaces of the dielectric caps 24.

Figure 3B:
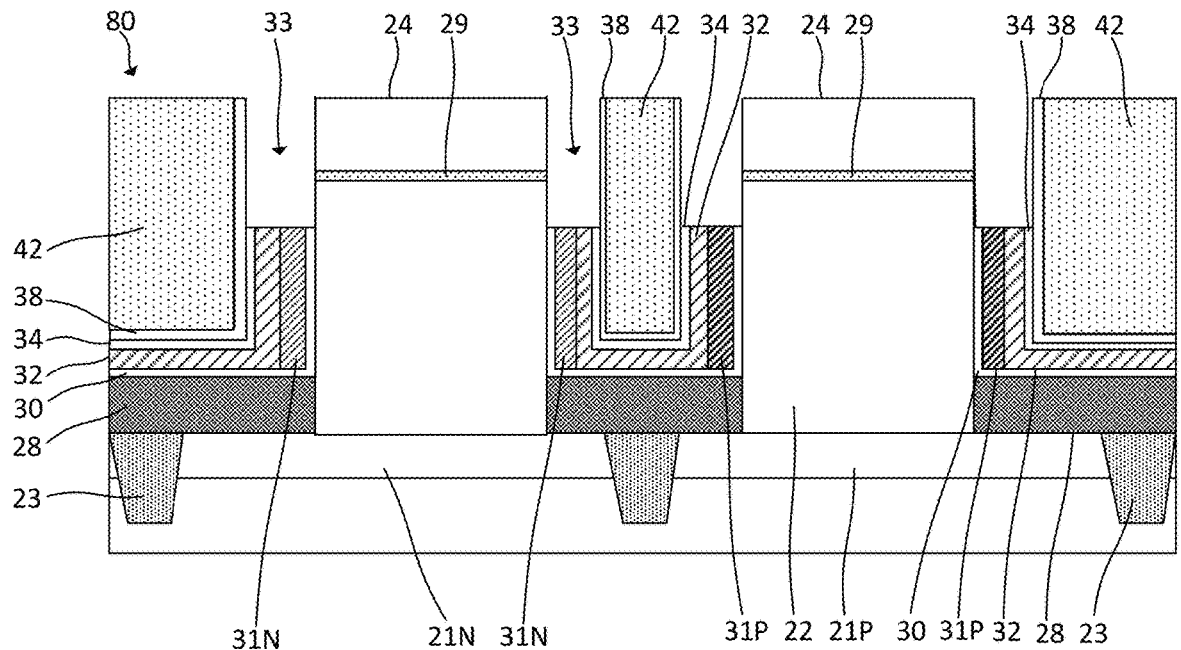
FIG. 3B is a sectional view showing the structure of FIG. 3A following formation of vertical trenches therein.

The WFM layers 31N, 31P and the common metal layer 32 are subjected to a timed etch. The vertical segments of these layers are thereby recessed. The remaining portions of the WFM layers and the common metal layer remain over the sidewall portions of the semiconductor fins 22, as shown in FIG. 3B. Portions of the vertical segments of the conformal layer 34 and the gate dielectric layer 30 are exposed following the recessing of the metal layers 31N, 31P, 32. These portions are removed to obtain a structure 80 as shown in FIG. 3B. Vertical trenches 33 within the structure 80 are formed between portions of the gate encapsulation layer 38 and the dielectric caps 24.

Figure 3C:
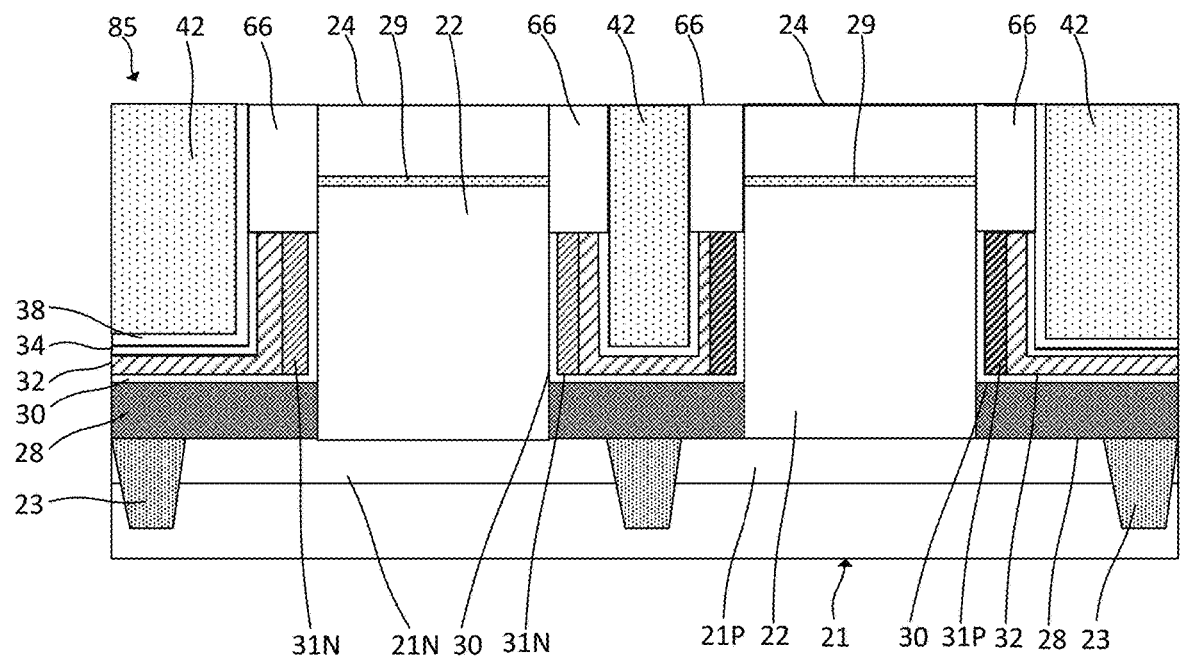
FIG. 3C is a sectional view showing the structure of FIG. 3B following deposition of a top spacer fill layer within the vertical trenches and planarization of the top spacer fill layer.

A top spacer fill layer 66 is deposited on the structure 80, filling the vertical trenches 33 therein. Compounds such as SiN, SiOC, or SiOCN may be deposited to form this layer. The top spacer fill layer 66 is recessed using CMP or other suitable process down to the coplanar top surfaces of the dielectric caps 24 and oxide fill layer 42. A monolithic structure 85 as schematically illustrated in FIG. 3C may be obtained.

Figure 3D:
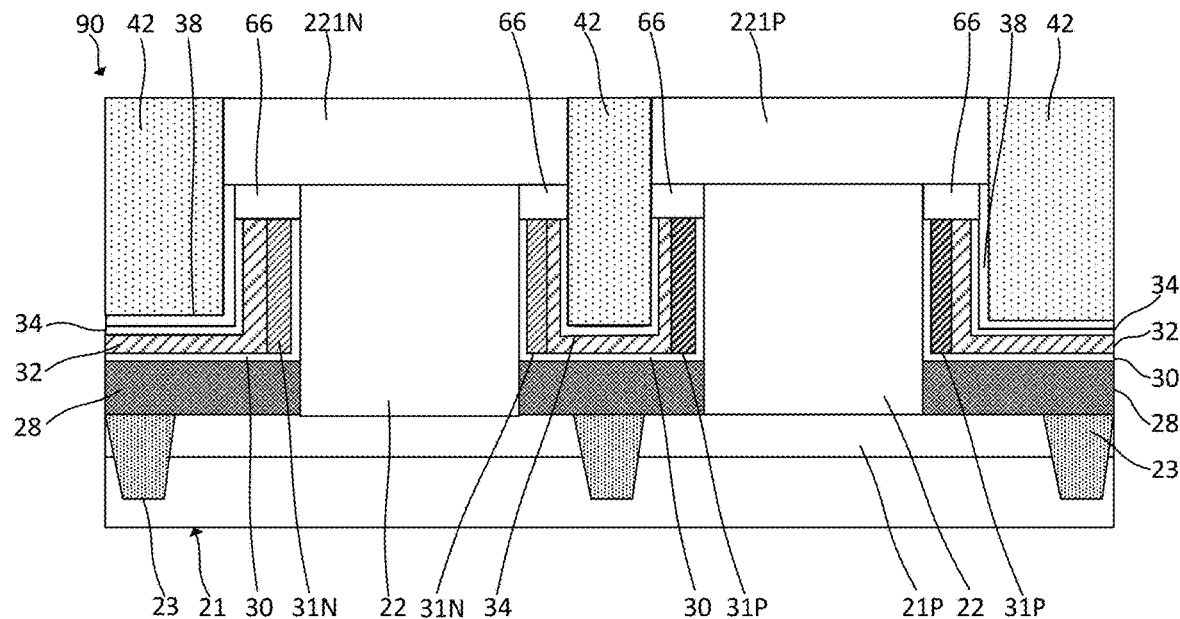
FIG. 3D is a sectional view showing the structure of FIG. 3C following growth of source/drain regions on the top surfaces of semiconductor fins in the nFET and pFET regions on exposed top.

The dielectric caps 24, the portions of the top spacer fill layer 66 adjoining the dielectric caps, and the oxide layer 29 are removed to expose the top surfaces of the semiconductor fins 22. Top source/drain regions 221N, 221P are then grown on the top surfaces of the fins to obtain a monolithic structure 90 as schematically illustrated in FIG. 3D. The growth of epitaxial source/drain regions is conducted sequentially as discussed above with respect to FIGS. 1F and 1G. Portions of the top source/drain regions may extend laterally over the remaining portions of the fill layer 66 which electrically isolate the top source/drain regions from the metal layers 31N, 31P, 32 below. Segments of the conformal layer 34 are positioned between the common metal layer 32 and the gate encapsulation layer 38 and protect the underlying metal from nitridation and/or oxidation that could adversely affect device performance.

Figure 4A:
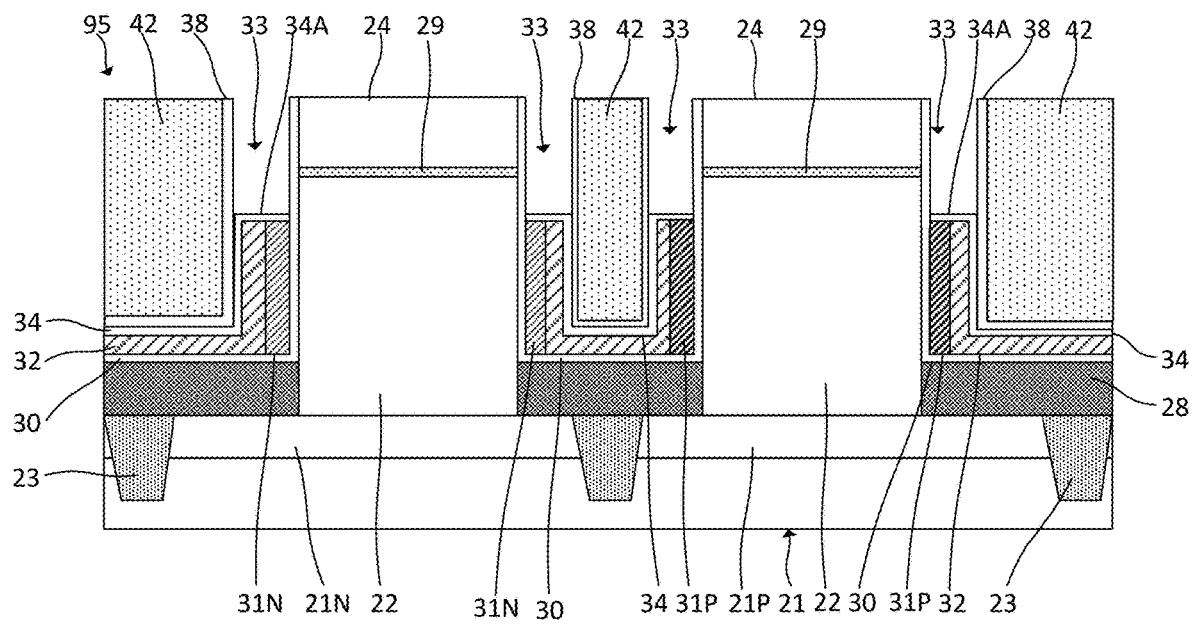
FIG. 4A is a schematic, cross-sectional illustration showing a process stage of a fourth exemplary process flow for fabricating a monolithic VTFET structure that includes an nFET region and a pFET region, each of the regions including a partially completed VTFET, a common metal layer, a conformal, amorphous layer over the common metal layer, a gate encapsulation layer over the conformal, amorphous layer, a fill layer over the nFET and pFET regions, and vertical trenches.
Figure 4B:
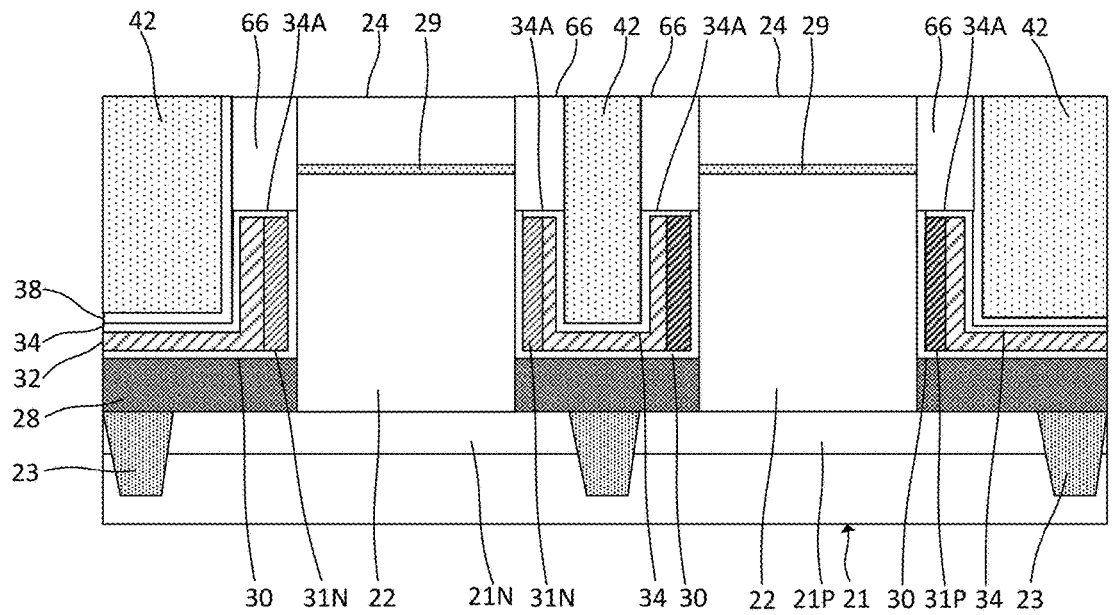
FIG. 4B is a sectional view showing the structure of FIG. 4A following deposition of a top spacer fill layer within the vertical trenches and planarization of the top spacer fill layer.
Figure 4C:
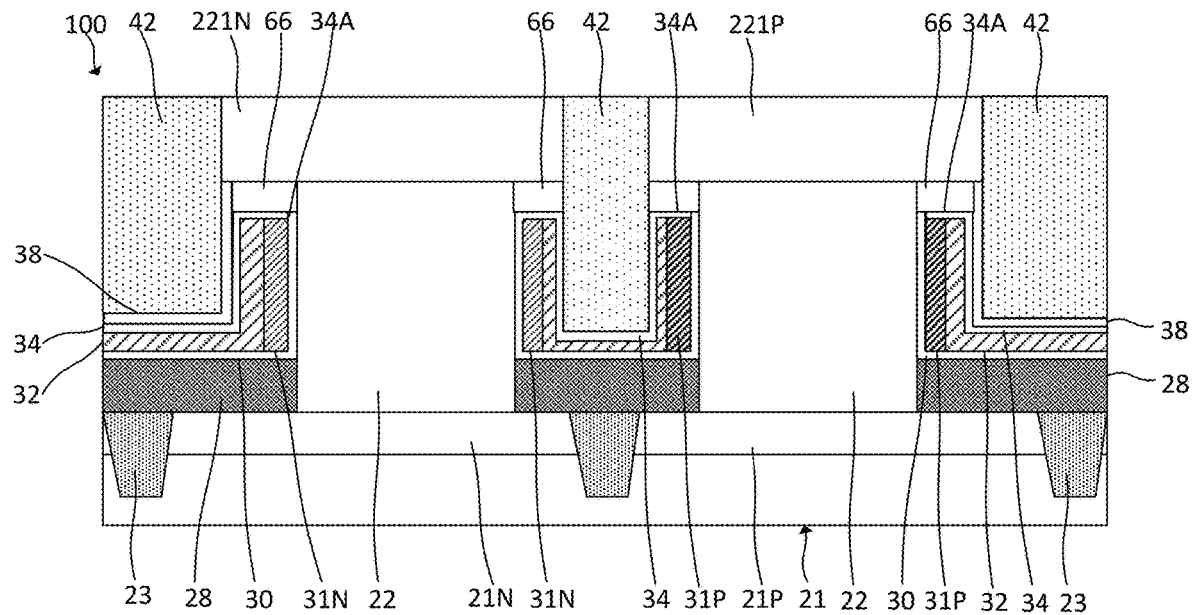
FIG. 4C is a sectional view showing the structure of FIG. 4B following growth of top source/drain regions on the top surfaces of semiconductor fins in the nFET and pFET regions.

Stages of a fourth exemplary process of fabricating a structure including VTFETs are schematically illustrated in FIGS. 4A-4C. These stages follow fabrication of earlier-stage structures such as the structure 20 described above with respect to FIG. 1A. In this exemplary process, a conformal amorphous silicon or silicon carbide layer 34 is deposited over the common metal layer 32. The thickness of the conformal layer 34, like those (34, 34) described above, is sufficient to form a continuous film. A gate encapsulation layer 38 is deposited over the conformal layer 34, the conformal layer protecting the underlying metal layers 32, 31N, 31P from damage during such deposition. A fill layer 42 is deposited on the resulting structure, thereby obtaining a structure similar to that shown in FIG. 3A. The structure is planarized, stopping at the top surfaces of the dielectric caps 24 and exposing top edge portions of the metal layers 32, 31N, 31P, the gate dielectric layer 30, and the conformal silicon or silicon carbide layer 34. A timed gate metal recess causes formation of vertical trenches 33 within the structure that extend below the top surfaces of the semiconductor fins 22. The portions of the conformal encapsulation layer 34 on the sidewalls of the trenches are then removed. Recessing of the portions of the metal layers and the conformal layer 34 is selective such that portions of the gate encapsulation layer 38 and the gate dielectric layer 30 line the surfaces of the trenches 33 following gate metal recessing, as shown in FIG. 4A.

A layer 34A of amorphous silicon or silicon carbide is formed on the top end portions of the metal layers 32, 31N, 31P and the conformal layer 34 at the bottom ends of the trenches 33. A directional deposition process may, for example, be employed to form an amorphous silicon or silicon carbide layer 34A of desired thickness. Alternatively, the trenches 33 may be filled with such material and etched back. The resulting structure 95 accordingly includes a continuous layer 34, 34A of amorphous silicon or amorphous silicon carbide protecting the underlying metal layers 32, 31N, 31P. As discussed above, the amorphous layer may or may not be entirely amorphous and may include, for example, microcrystalline and/or polycrystalline regions in an otherwise predominantly amorphous layer. The bottom surfaces of the trenches 33 formed by the amorphous layer 34A remain beneath the bottom surfaces of the dielectric caps 24, as schematically illustrated in FIG. 4A. Each segment of the layer 34A adjoins the gate encapsulation layer 38 at one end and the gate dielectric layer 30 at an opposite end.

The portions of the gate dielectric layer above the amorphous layer 34A are selectively removed from the trenches 33. A top spacer layer 66 is deposited on the resulting structure and subjected to CMP. The portions of the top spacer layer 66 that remain following CMP fill the trenches 33, as shown in FIG. 4B. The top amorphous layer 34A, like the conformally deposited amorphous layer 34, protect the underlying metal from nitridation and/or oxidation that could be caused by subsequently deposited layers such as the top spacer layer 66. The planarization process causes the exposure of the top surfaces of the dielectric caps 24 on the semiconductor fins 22.

The dielectric caps 24, the portions of the top spacer fill layer 66 adjoining the dielectric caps, and the oxide layer 29 are removed to expose the top surfaces of the semiconductor fins 22. Top source/drain regions 221N, 221P are then grown on the top surfaces of the fins to obtain a monolithic structure 100 as schematically illustrated in FIG. 4C. The growth of epitaxial source/drain regions is conducted sequentially as discussed above with respect to FIGS. 1F and 1G. Portions of the top source/drain regions may extend laterally over the remaining portions of the top spacer fill layer 66. The amorphous layer 34A is between the top spacer fill layer 66 and the top ends of the metal (gate) layers. Segments of the conformal layer 34 are positioned between the common metal layer 32 and the gate encapsulation layer 38. Gate metal sidewall and top surface protection are accordingly provided.

Following completion of the exemplary monolithic structure 100, an interlevel dielectric layer (not shown) can be deposited and the transistor wiring can be formed. An exemplary wiring process is described above with respect to FIGS. 1G and 1H and can be employed with respect to the structure 100 shown in FIG. 4C.

Semiconductor device manufacturing includes various steps of device patterning processes. For example, the manufacturing of a semiconductor chip may start with, for example, a plurality of CAD (computer aided design) generated device patterns, which is then followed by effort to replicate these device patterns in a substrate. The replication process may involve the use of various exposing techniques and a variety of subtractive (etching) and/or additive (deposition) material processing procedures. For example, in a photolithographic process, a layer of photo-resist material may first be applied on top of a substrate, and then be exposed selectively according to a pre-determined device pattern or patterns. Portions of the photo-resist that are exposed to light or other ionizing radiation (e.g., ultraviolet, electron beams, X-rays, etc.) may experience some changes in their solubility to certain solutions. The photo-resist may then be developed in a developer solution, thereby removing the non-irradiated (in a negative resist) or irradiated (in a positive resist) portions of the resist layer, to create a photo-resist pattern or photo-mask. The photo-resist pattern or photo-mask may subsequently be copied or transferred to the substrate underneath the photo-resist pattern.

There are numerous techniques used by those skilled in the art to remove material at various stages of creating a semiconductor structure. As used herein, these processes are referred to generically as "etching". For example, etching includes techniques of wet etching, dry etching, chemical oxide removal (COR) etching, and reactive ion etching (RIE), which are all known techniques to remove select material(s) when forming a semiconductor structure. The Standard Clean 1 (SC1) contains a strong base, typically ammonium hydroxide, and hydrogen peroxide. The SC2 contains a strong acid such as hydrochloric acid and hydrogen peroxide. The techniques and application of etching is well understood by those skilled in the art and, as such, a more detailed description of such processes is not presented herein.

Although the overall fabrication method and the structures formed thereby are novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. Moreover, one or more of the processing steps and tooling used to fabricate semiconductor devices are also described in a number of readily available publications, including, for example: James D. Plummer et al., *Silicon VLSI Technology: Fundamentals, Practice, and Modeling* 1$^{st}$ *Edition*, Prentice Hall, 2001 and P. H. Holloway et al., *Handbook of Compound Semiconductors: Growth, Processing, Characterization, and Devices*, Cambridge University Press, 2008, which are both hereby incorporated by reference herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more semiconductor layers of a type commonly used in such integrated circuit devices may not be explicitly shown in a given figure for ease of explanation. This does not imply that the semiconductor layer(s) not explicitly shown are omitted in the actual integrated circuit device.

Given the discussion thus far, it will be appreciated that, in general terms, an exemplary method of fabricating a vertical transport field-effect transistor structure includes obtaining a first structure including a semiconductor fin 22 extending vertically from a substrate 21, the semiconductor fin including a top region, a bottom region, and a channel region between the top region and the bottom region. A bottom source/drain region 21N or 21P adjoins the bottom region of the semiconductor fin 22 and a gate dielectric layer 30 adjoins the channel region of the semiconductor fin. A gate metal layer (31N/32 or 31P/32) adjoins the gate dielectric layer 30. A bottom electrically insulating spacer 28 is between the bottom source/drain region and the gate metal layer. A dielectric cap 24 is on a top surface of the semiconductor fin 22. FIG. 1A shows an exemplary first structure 20.

The exemplary method further includes conformally depositing an amorphous encapsulation layer 34 comprising amorphous silicon or amorphous silicon carbide on the first structure 20. The amorphous encapsulation layer 34 forms a continuous film on the gate metal layer. A dielectric encapsulation layer (38 in FIGS. 1E, 3A and 4A, 62A in FIG. 2B) is deposited on the amorphous encapsulation layer. The amorphous encapsulation layer 34 prevents nitridation and/or oxidation of the underlying gate metal layer that could otherwise occur upon deposition of the dielectric encapsulation layer. A top surface of the semiconductor fin 22 is exposed by removing a top portion of the amorphous encapsulation layer 34 and the dielectric cap 24. A top source/drain region (221N or 221P) is then grown on the top region of the semiconductor fin. In some embodiments, vertical sidewall spacers are formed from the amorphous encapsulation layer 34, such as shown in FIG. 1B. Portions of the vertical sidewall spacers 34, the gate dielectric layer 30, and the gate metal layer are removed above the channel region of the semiconductor fin as shown in FIG. 1D. The dielectric encapsulation layer 38 is then conformally deposited on the vertical sidewall spacers and over the dielectric cap 24, such as shown in FIG. 1E.

In some embodiments of the exemplary method, a sacrificial layer 36 is formed on the first structure and extends over the bottom portion of the gate metal layer. The portion of the gate metal layer above the top surface of the sacrificial layer is removed, thereby obtaining a structure 65 as shown in FIG. 2A. The sacrificial layer is then removed. The exemplary method may further include forming a bottom fill layer 62A (as shown in FIG. 2B) over the amorphous encapsulation layer 34 and removing the amorphous encapsulation layer 34 above a top surface of the bottom fill layer while the remainder of the amorphous encapsulation layer remains intact. In a further embodiment of the exemplary method, a fill layer is deposited over a conformal dielectric encapsulation layer and recessed, thereby exposing a top surface of the dielectric cap 24 and top surfaces of the gate metal layer, the gate dielectric layer 30, the dielectric encapsulation layer 38, and the amorphous encapsulation layer 34. Portions of the gate metal layer, the gate dielectric layer 30 and the amorphous encapsulation layer 34 are selectively removed, thereby forming vertical trenches 33 on opposite sides of the dielectric cap 24. FIG. 4A shows and exemplary structure 95 prior to removal of the gate dielectric layer 30. A second amorphous encapsulation layer 34A is formed within the vertical trenches. Dielectric spacers are formed within the vertical trenches and extend below the top surface of the semiconductor fin 22. The bottom surfaces of the spacers 66 adjoin the second amorphous encapsulation layer 34A, as shown in FIG. 4C, and therefore will not cause the introduction of oxygen or nitrogen into the underlying metal layers. The gate metal layer in all exemplary embodiments may include a work function metal layer 31N or 31P. A common metal layer 32 adjoins the work function metal layer may be employed to electrically connect the metal gates of transistors in adjoining regions. The amorphous encapsulation layer 34 is deposited directly on the common metal layer 32.

Further given the above discussion, a vertical transport field-effect transistor structure includes a substrate 21, a first vertical transport field-effect device including a first semiconductor fin 22 extending vertically with respect to the substrate and including a top region, a bottom region, and a channel region between the top region and the bottom region. A first bottom source/drain region 21A adjoins the bottom region of the first semiconductor fin and has a first conductivity type (for example, n-type). A first gate dielectric layer 30 adjoins the channel region of the semiconductor fin 22. A first work function metal layer adjoins the gate dielectric layer. A bottom dielectric spacer layer 28 is between the first bottom source/drain region 21A and the first work function metal layer. A first top source/drain region (for example, 221N) is on the top region of the first semiconductor fin. The vertical transport field-effect transistor structure further includes a second vertical transport field-effect device including essentially the same elements as the first VTFET structure, though the source/drain regions thereof are oppositely doped and the work function metal layer(s) may be different from that used in the first VTFET structure. A common metal layer 32 including vertical segments extends over the work function layer of each VTFET structure. The common metal layer further includes a horizontal segment extending over the bottom spacer layer and between the first vertical transport field-effect device and the second vertical transport field-effect device. A conformal amorphous encapsulation layer 34 comprising amorphous silicon or amorphous silicon carbide adjoins the sidewalls of the vertical segments of the common metal layer. A dielectric encapsulation layer adjoins the conformal amorphous encapsulation layer. The dielectric encapsulation layer may be a conformal layer 38 as illustrated in FIGS. 3D and 4C or a layer deposited non-conformally such as the bottom fill layer 62A shown in FIG. 2E. The amorphous encapsulation layer is configured to protect the underlying metal layers from nitridation or oxidation that could otherwise be caused by the deposition of the dielectric encapsulation layer (38 or 62A) on the metal layers.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from having VTFETs therein.

An integrated circuit in accordance with aspects of the present inventions can be employed in essentially any application and/or electronic system where the use of VTFETs would be beneficial. Given the teachings of the present disclosure provided herein, one of ordinary skill in the art will be able to contemplate other implementations and applications of embodiments disclosed herein.

The illustrations of embodiments described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this disclosure. It should also be noted that, in some alternative implementations, some of the steps of the exemplary methods may occur out of the order noted in the figures. For example, two steps shown in succession may, in fact, be executed substantially concurrently, or certain steps may sometimes be executed in the reverse order, depending upon the functionality involved. The drawings are also merely representational and are not drawn to scale. Accordingly, the specification and drawings are to be regarded in an illustrative rather than a restrictive sense.

Embodiments are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "bottom", "top", "above", "over", "under" and "below" are used to indicate relative positioning of elements or structures to each other as opposed to relative elevation. If a layer of a structure is described herein as "over" another layer, it will be understood that there may or may not be intermediate elements or layers between the two specified layers. If a layer is described as "directly on" another layer, direct contact of the two layers is indicated. As the term is used herein and in the appended claims, "about" means within plus or minus ten percent.

The corresponding structures, materials, acts, and equivalents of any means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit thereof. The embodiments were chosen and described in order to best explain principles and practical applications, and to enable others of ordinary skill in the art to understand the various embodiments with various modifications as are suited to the particular use contemplated.

The abstract is provided to comply with 37 C.F.R. § 1.76(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, the claimed subject matter may lie in less than all features of a single embodiment. Thus the following claims are hereby incorporated into the Detailed Description, with each claim standing on its own as separately claimed subject matter.

Given the teachings provided herein, one of ordinary skill in the art will be able to contemplate other implementations and applications of the techniques and disclosed embodiments. Although illustrative embodiments have been described herein with reference to the accompanying drawings, it is to be understood that illustrative embodiments are not limited to those precise embodiments, and that various other changes and modifications are made therein by one skilled in the art without departing from the scope of the appended claims.

What is claimed is:

1. A method of fabricating a vertical transport field-effect transistor structure, comprising:
   obtaining a first structure including a semiconductor fin extending vertically from a substrate, the semiconductor fin including a top region, a bottom region, and a channel region between the top region and the bottom region, a bottom source/drain region adjoining the bottom region of the semiconductor fin, a gate dielectric layer adjoining the channel region of the semiconductor fin, a gate metal layer adjoining the gate dielectric layer, a bottom electrically insulating spacer between the bottom source/drain region and the gate metal layer, and a dielectric cap on a top surface of the semiconductor fin;
   conformally depositing an amorphous encapsulation layer at a temperature of about four hundred degrees Centigrade or less on the first structure, the amorphous encapsulation layer comprising amorphous silicon, amorphous silicon carbide, amorphous germanium, or amorphous silicon germanium and forming a continuous film on the gate metal layer;
   depositing a dielectric encapsulation layer on the amorphous encapsulation layer;
   exposing a top surface of the semiconductor fin, wherein exposing the top surface of the semiconductor fin includes removing a top portion of the amorphous encapsulation layer and the dielectric cap; and
   epitaxially growing a top source/drain region on the top region of the semiconductor fin.

2. The method of claim 1, wherein conformally depositing the amorphous encapsulation layer includes depositing amorphous silicon.

3. The method of claim 1, further including:
   forming vertical sidewall spacers from the amorphous encapsulation layer;
   removing portions of the vertical sidewall spacers, the gate dielectric layer and the gate metal layer above the channel region of the semiconductor fin;
   wherein depositing the dielectric encapsulation layer on the amorphous encapsulation layer further includes conformally depositing the dielectric encapsulation layer on the vertical sidewall spacers and over the dielectric cap.

4. The method of claim 3, further including:
   depositing an oxide layer over the dielectric encapsulation layer; and
   forming a recess within the oxide layer down to the top surface of the semiconductor fin, wherein forming the recess includes removing a portion of the dielectric encapsulation layer extending over the dielectric cap and removing the dielectric cap.

5. The method of claim 1, further including:
   forming a sacrificial layer on the first structure, the sacrificial layer extending over the gate metal layer and having a top surface below the top surface of the semiconductor fin;
   removing a portion of the gate metal layer above the top surface of the sacrificial layer; and
   removing the sacrificial layer following removal of the portion of the gate metal layer,
   wherein conformally depositing the amorphous encapsulation layer includes forming vertically extending layer portions and horizontally extending layer portions, the horizontally extending layer portions of the amorphous encapsulation layer extending over a top surface of the gate metal layer.

6. The method of claim 5, further including:
   depositing a bottom fill layer over the amorphous encapsulation layer, the bottom fill layer extending over the horizontally extending portions of the amorphous encapsulation layer; and
   removing the amorphous encapsulation layer above a top surface of the bottom fill layer.

7. The method of claim 6, further including:
   depositing a conformal dielectric liner over the bottom fill layer and the dielectric cap;
   depositing a top fill layer over the conformal dielectric layer; and
   forming a recess in the top fill layer extending down to the top surface of the semiconductor fin, wherein the top source/drain region is epitaxially grown within the recess.

8. The method of claim 1, wherein depositing the dielectric encapsulation layer on the amorphous encapsulation layer includes conformally depositing the dielectric encapsulation layer on the amorphous encapsulation layer, further including:
   depositing a fill layer over the dielectric encapsulation layer;
   recessing the fill layer, thereby exposing a top surface of the dielectric cap and top surfaces of the gate metal layer, the gate dielectric layer, the dielectric encapsulation layer, and the amorphous encapsulation layer;

selectively removing portions of the gate metal layer, the gate dielectric layer and the amorphous encapsulation layer, thereby forming vertical trenches on opposite sides of the dielectric cap; and forming dielectric spacers within the vertical trenches, the dielectric spacers extending below the top surface of the semiconductor fin and having bottom surfaces adjoining the gate metal layer, the gate dielectric layer, and the amorphous encapsulation layer.

9. The method of claim 1, wherein depositing the dielectric encapsulation layer on the amorphous encapsulation layer includes conformally depositing the dielectric encapsulation layer on the amorphous encapsulation layer, further including:

depositing a fill layer over the dielectric encapsulation layer;

recessing the fill layer, thereby exposing a top surface of the dielectric cap and top surfaces of the gate metal layer, the gate dielectric layer, the dielectric encapsulation layer, and the amorphous encapsulation layer;

selectively removing portions of the gate metal layer, the gate dielectric layer and the amorphous encapsulation layer, thereby forming vertical trenches on opposite sides of the dielectric cap;

forming a second amorphous encapsulation layer within the vertical trenches;

forming dielectric spacers within the vertical trenches, the dielectric spacers extending below the top surface of the semiconductor fin and having bottom surfaces adjoining the second amorphous encapsulation layer.

10. The method of claim 9, wherein the metal layer includes a work function metal layer and a common metal layer, further including conformally depositing the amorphous encapsulation layer directly on the common metal layer.

11. The method of claim 10, wherein the common metal layer includes a horizontal segment extending over the bottom electrically insulating spacer to a second structure, further including conformally depositing the amorphous encapsulation layer on the horizontal segment of the common metal layer.

12. A method of fabricating a vertical transport field-effect transistor structure, comprising:

obtaining a first structure including:
first and second semiconductor fins extending vertically from a substrate, each of the first and second semiconductor fins including a top region, a bottom region, and a channel region between the top region and the bottom region, a first bottom source/drain region adjoining the bottom region of the first semiconductor fin and a second bottom source/drain region adjoining the bottom region of the second semiconductor fin;

a gate dielectric layer having a first portion adjoining the channel region of the first semiconductor fin and a second portion adjoining the channel region of the second semiconductor fin;

a first work function metal layer adjoining the first portion of the gate dielectric layer and a second work function metal layer adjoining the second portion of the gate dielectric layer;

a common metal layer adjoining and electrically connecting the first and second work function metal layers; and a first dielectric cap on a top surface of the first semiconductor fin and a second dielectric cap on a top surface of the second semiconductor fin;

conformally depositing an amorphous encapsulation layer at a temperature of about four hundred degrees Centigrade or less on the common metal layer, the amorphous encapsulation layer comprising amorphous silicon, amorphous silicon carbide, amorphous germanium, or amorphous silicon germanium and forming a continuous film on the common metal layer;

depositing a dielectric encapsulation layer on the amorphous encapsulation layer;

exposing a top surface of the first semiconductor fin, wherein exposing the top surface of the first semiconductor fin includes removing a first top portion of the amorphous encapsulation layer and the first dielectric cap;

epitaxially growing a first top source/drain region having a first conductivity type on the top region of the first semiconductor fin;

exposing a top surface of the second semiconductor fin, wherein exposing the top surface of the second semiconductor fin includes removing a second top portion of the amorphous encapsulation layer and the second dielectric cap; and epitaxially growing a second top source/drain region having a second conductivity type opposite to the first conductivity type on the top region of the second semiconductor fin.

13. The method of claim 12, further including:

forming vertical sidewall spacers on the common metal layer from the amorphous encapsulation layer;

removing portions of the vertical sidewall spacers, the gate dielectric layer, the common metal layer and the first and second work function metal layers above the channel regions of the first and second semiconductor fins;

wherein depositing the dielectric encapsulation layer on the amorphous encapsulation layer further includes conformally depositing the dielectric encapsulation layer on the vertical sidewall spacers and over the first and second dielectric caps.

14. A vertical transport field-effect transistor structure, comprising:

a substrate;

a first vertical transport field-effect device including:
a first semiconductor fin extending vertically with respect to the substrate, the first semiconductor fin including a top region, a bottom region, and a channel region between the top region and the bottom region;

a first bottom source/drain region adjoining the bottom region of the first semiconductor fin and having a first conductivity type;

a first gate dielectric layer adjoining the channel region of the first semiconductor fin, the first gate dielectric layer including top edge portions;

a first work function metal layer adjoining the gate dielectric layer, the first work function metal layer including top edge portions;

a bottom dielectric spacer layer between the first bottom source/drain region and the first work function metal layer; and a first top source/drain region on the top region of the first semiconductor fin and having the first conductivity type;

a second vertical transport field-effect device including:
a second semiconductor fin extending vertically with respect to the substrate, the second semiconductor fin including a top region, a bottom region, and a channel region between the top region and the bottom region;

a second bottom source/drain region adjoining the bottom region of the second semiconductor fin and having a second conductivity type opposite to the first conductivity type;

a second gate dielectric layer adjoining the channel region of the second semiconductor fin, the second gate dielectric layer including top edge portions;

a second work function metal layer adjoining the second gate dielectric layer, the second work function metal layer including top edge portions, the bottom dielectric spacer further extending between the second bottom source/drain region and the second work function metal layer; and a second top source/drain region having the second conductivity type on the top region of the second semiconductor fin;

a common metal layer including vertical segments extending over the first work function layer and the second work function layer, each of the vertical segments including a sidewall and a top edge portion, the common metal layer further including a horizontal segment extending over the bottom spacer layer and between the first vertical transport field-effect device and the second vertical transport field-effect device;

a conformal amorphous encapsulation layer comprising amorphous silicon, amorphous silicon carbide, amorphous Ge, or amorphous SiGe, the conformal amorphous encapsulation layer adjoining each sidewall of the vertical segments of the common metal layer; and a dielectric encapsulation layer adjoining the conformal amorphous encapsulation layer.

15. The vertical transport field-effect transistor structure of claim 14, wherein the conformal amorphous encapsulation layer comprises a conformal amorphous silicon film.

16. The vertical transport field-effect transistor structure of claim 14, wherein the conformal amorphous encapsulation layer further adjoins the horizontal segment of the common metal layer.

17. The vertical transport field-effect transistor structure of claim 14, wherein the dielectric encapsulation layer is a conformal layer.

18. The vertical transport field-effect transistor structure of claim 17, further including an amorphous silicon top layer adjoining the top edges of the common metal layer and the work function metal layer.

19. The vertical transport field-effect transistor structure of claim 18, wherein the amorphous silicon top layer is a conformal layer integral with the conformal amorphous encapsulation layer.

20. The vertical transport field-effect transistor structure of claim 18, wherein the conformal amorphous encapsulation layer comprises a conformal amorphous silicon film.

* * * * *